(12) United States Patent
Taraki et al.

(10) Patent No.: US 6,556,202 B1
(45) Date of Patent: *Apr. 29, 2003

(54) SYSTEM FOR RECONFIGURING OSCILLOSCOPE SCREEN IN FREEZE MODE

(75) Inventors: Yosuf M. Taraki, Evanston, IL (US); Dale A. Trsar, Mt. Prospect, IL (US); Richard H. Shepherd, McHenry, IL (US); Mark H. Petersen, Mundelein, IL (US); Tyrone J. Moritz, Morton Grove, IL (US)

(73) Assignee: Snap-on Technologies, Inc., Lincolnshire, IL (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 1004 days.

(21) Appl. No.: 08/629,484

(22) Filed: Apr. 10, 1996

(51) Int. Cl.⁷ ............................................. G06T 11/20
(52) U.S. Cl. .................................... 345/440.1; 345/440
(58) Field of Search .......................... 345/133, 134, 345/135, 440, 440.1, 441; 324/379, 380

(56) References Cited

U.S. PATENT DOCUMENTS

| | | | | |
|---|---|---|---|---|
| 3,585,440 A | * | 6/1971 | Lee | 319/19 |
| 4,467,323 A | * | 8/1984 | Kling et al. | 345/133 |
| 5,039,937 A | | 8/1991 | Mandt et al. | |
| 5,081,592 A | | 1/1992 | Jenq | |
| 5,129,722 A | * | 7/1992 | Mader et al. | 345/134 |
| 5,245,324 A | | 9/1993 | Jonker et al. | |
| 5,250,935 A | * | 10/1993 | Jonker et al. | 345/134 |
| 5,323,173 A | * | 6/1994 | Sakuma et al. | 345/134 |
| 5,365,254 A | * | 11/1994 | Kawamoto | 345/134 |
| 5,444,459 A | * | 8/1995 | Moriyasu | 345/134 |

\* cited by examiner

*Primary Examiner*—Kent Chang
(74) *Attorney, Agent, or Firm*—Seyfarth Shaw

(57) ABSTRACT

A digital engine analyzer has an oscilloscope display screen operable in single-trace and dual-trace modes and in live and freeze modes, and having signal pickup leads for respectively acquiring different input signal waveforms from the engine and digitizing them for storage and display. When the freeze mode is entered, the last-displayed screen display format is frozen, and can then be reconfigured by the user by altering one or more of the number of traces, the signal plotted on each trace, the engine sweep of each trace, the scale and the scale offset for each trace and, in the case of a cylinder sweep, the displayed cylinder. In dual trace screen display formats, the user can also select for display on trace 2 a waveform pattern selected from a stored library of patterns.

20 Claims, 20 Drawing Sheets

SYSTEM FOR RECONFIGURING OSCILLOSCOPE SCREEN IN FREEZE MODE

BACKGROUND OF THE INVENTION

1. Field of the Invention

The present invention relates to digital storage oscilloscopes, and in particular, to engine analyzers incorporating such oscilloscopes as display devices. The invention has particular application to dual-trace oscilloscopes operable in live and freeze modes.

2. Description of the Prior Art

It is known to provide digital oscilloscopes with multiple display traces (e.g., two), so that a number of waveforms can be simultaneously displayed. A dual-trace scope can typically be operated either in single-trace or dual-trace mode. It is also known to provide engine analyzers with display screens which essentially constitute digital oscilloscopes. Such analyzers acquire analog waveforms from an associated engine by means of pickup leads and then digitize the waveforms for storage in memory and display on the digital oscilloscope screen.

The horizontal scale (also called sweep) of an oscilloscope screen represents time. Broadly speaking, in a digital analyzer scope there are two types of sweeps: engine sweeps and fixed-time sweeps. Engine sweeps are of three types, cylinder sweep which display waveforms for a single cylinder cycle (the time between the firing of two consecutive cylinders in the firing order), and parade and raster sweeps for displaying a waveform over a complete engine cycle (the time between consecutive firings of the same cylinder). A parade sweep displays the cylinders spaced horizontally across the width of the screen and a raster sweep displays the cylinders stacked vertically one atop the other on the same time base. Engine sweeps are typically used to display waveforms related to cylinder ignition events. Fixed-time sweeps (e.g., 10 ms, 100 ms, etc.) display a fixed period of time across the width of the display screen, and are typically used to display waveforms other than primary and secondary ignition waveforms.

It is known in prior digital engine analyzers to operate the analyzer in either ignition scope mode or standard lab scope mode. The ignition scope mode is normally used for analyzing primary and secondary ignition waveforms. The lab scope mode is used for analyzing waveforms other than primary and secondary ignition waveforms, the display of which other waveforms utilizes a fixed-time sweep.

Digital engine analyzers with oscilloscope displays typically have two modes of operation, viz., live and freeze. In the live mode, one or more selected input signals are repeatedly sampled by a data acquisition system and the resulting digitized waveform data is displayed on the screen of the oscilloscope and saved in memory. When the freeze mode is activated, data acquisition is suspended and the most recently-displayed section of waveform data remains "frozen" on the screen. At this point the operator can review previously acquired waveform data that has been saved in memory by recalling it from memory and displaying it on the screen.

It is also known to provide an engine analyzer with a database of reference information which includes a library of signal waveform patterns, which may include generic standard or reference patterns, known "good" patterns for a properly operating engine, or known "bad" patterns which typify known specific trouble conditions. Library patterns can also be called from memory and displayed on a trace of the oscilloscope screen.

When prior engine analyzers are operating in a freeze mode, there is little that the operator can do to manipulate or reconfigure the waveform data displayed on the screen. In some analyzers it is possible for the operator to change the scale of a frozen waveform and, in some general purpose laboratory oscilloscopes, it is known to permit alteration of a fixed-time sweep for the display of a frozen waveform. But that is about the limit of an operator's control of frozen waveforms.

SUMMARY OF THE INVENTION

It is a general object of the invention to provide an improved digital oscilloscope which avoids the disadvantages of prior oscilloscopes while affording additional structural and operating advantages.

An important feature of the invention is the provision of an oscilloscope of the type set forth, which is operable in single-trace and dual-trace and in live and freeze modes, and which permits an operator to reconfigure a frozen screen display format by altering any of a number of different display parameters.

In connection with the foregoing feature, a further feature of the invention is the provision of an apparatus of the type set forth, wherein the parameters which can be altered include the number of traces in the display format, the particular signal displayed on a trace, scale of the display and the zero-offset point of the scale.

Yet another feature of the invention is the provision of an apparatus of the type set forth embodied in an engine analyzer for monitoring waveforms of multi-cylinder internal combustion engines, wherein the parameters which can be altered include the engine sweep of the waveform display and, in the case of a cylinder sweep, the cylinder displayed.

These and other features of the invention are attained by providing apparatus for monitoring analog input waveforms comprising: waveform acquisition means including signal pickup leads adapted to be coupled to an associated source for respectively receiving different analog input signals and generating digitized waveform data representative of such analog signals, memory means for storing digitized waveform data, an oscilloscope display device having a display screen for displaying stored waveform data from one or more input signals in a screen display format which includes one or more waveform representations on one or more traces, and processing means coupled to the waveform acquisition means and to the memory means and to the display device and operable under stored program control for controlling storage and display of waveform data, the processing means including freeze control means for selectively operating the display device in either a live mode in which acquired waveform data is displayed substantially currently as acquired and a freeze mode in which a screen display format is frozen on the screen, the freeze control means including means selectively operable for reconfiguring a frozen screen display format by altering the number of traces and/or the signal displayed on a trace.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated.

DESCRIPTION OF THE PREFERRED EMBODIMENT

Figure 1:
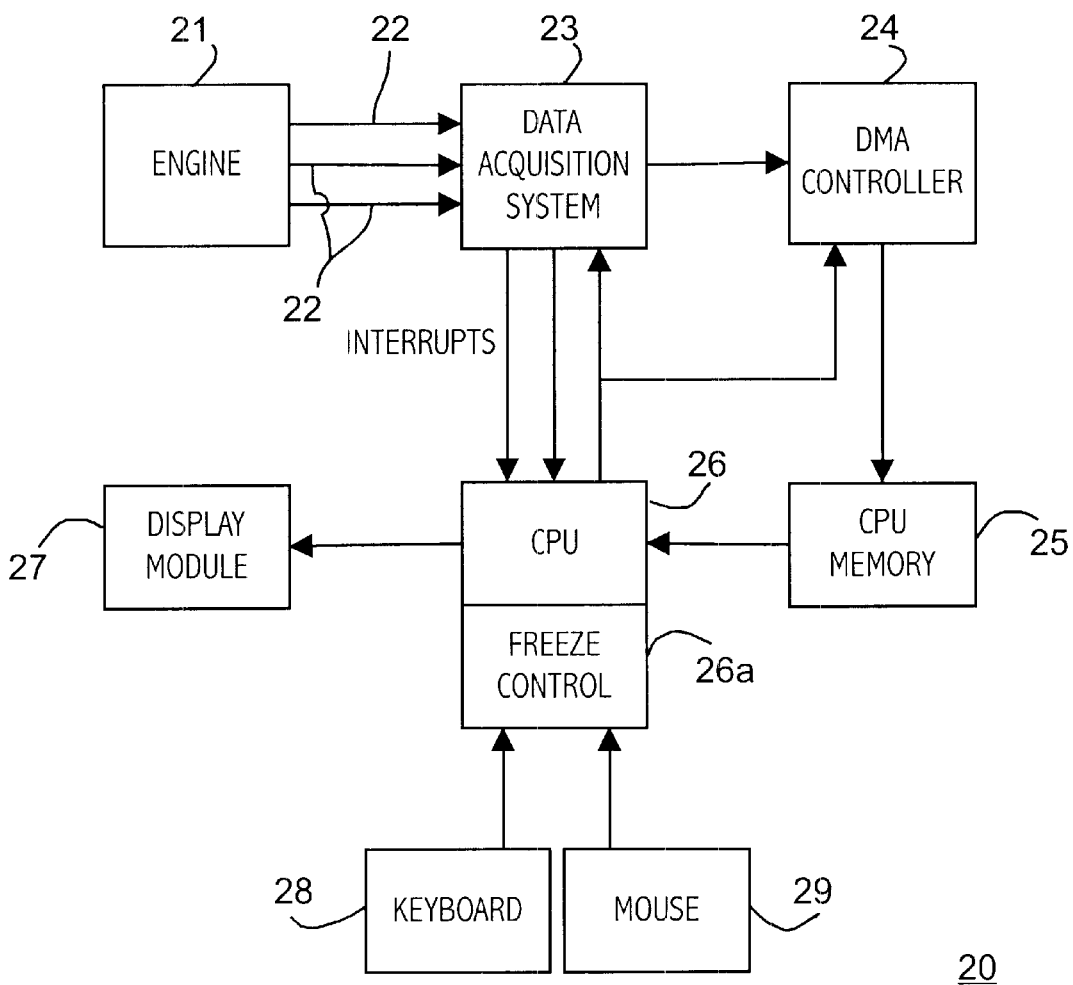
FIG. 1 is a functional block diagram of an engine analyzer system incorporating a digital oscilloscope display in accordance with the present invention.

Referring to FIG. 1, there is illustrated an engine analyzer, generally designated by the numeral 20, in accordance with the present invention. The analyzer 20 is adapted to be coupled to an associated multi-cylinder internal combustion engine 21 for acquiring and analyzing waveform signals generated by the engine 21. For this purpose, the analyzer 20 is provided with a plurality of signal pickup leads 22 adapted to be coupled to selected points in the engine 21 for transferring input analog waveform signals to a waveform data acquisition system 23. While three leads 22 have been shown, simply by way of illustration, it will be appreciated that a larger number of leads could be provided. The waveform data acquisition system 23 may include suitable conditioning circuits and trigger detection circuits in a known manner, and also includes an analog-digital converter (ADC) for digitizing the analog input signals to generate digital waveform data in a known manner. The waveform data is applied to a DMA (direct memory access) controller 24 which, in turn, controls the storage of the waveform data in a memory 25.

The analyzer 20 is provided with a suitable central processing unit (CPU) 26, which may be in the form of a microprocessor operating under stored program control and which is coupled to the waveform data acquisition system 23, the DMA controller 24 and the memory 25. In particular, the CPU 26 receives interrupts from the waveform data acquisition system 23 and controls the sampling of the analog waveform by the ADC and it also controls the operation of the DMA controller 24 for controlling the writing of waveform data to the memory 25. The CPU 26 includes a freeze control function 26a for controlling the selection and operation of a freeze display mode for an associate display module 27, which is coupled to the CPU 26. Preferably, the display module 27 is a color digital oscilloscope which is operable in live and freeze modes and in single-trace and dual-trace modes, with various sweeps and various types of triggering. In addition to the usual engine and fixed-time sweeps, the analyzer 20 supports engine 5 ms sweeps which correspond, respectively, to the three types of engine sweeps, except that only the first 5 ms of the waveform is displayed for each cylinder. In use, waveform data read from the memory 25 is passed through the CPU 26 to the display module 27. The CPU 26 is preferably provided with a suitable user interface, which may include a keyboard 28 and/or a mouse 29 in a known manner.

Figure 2:
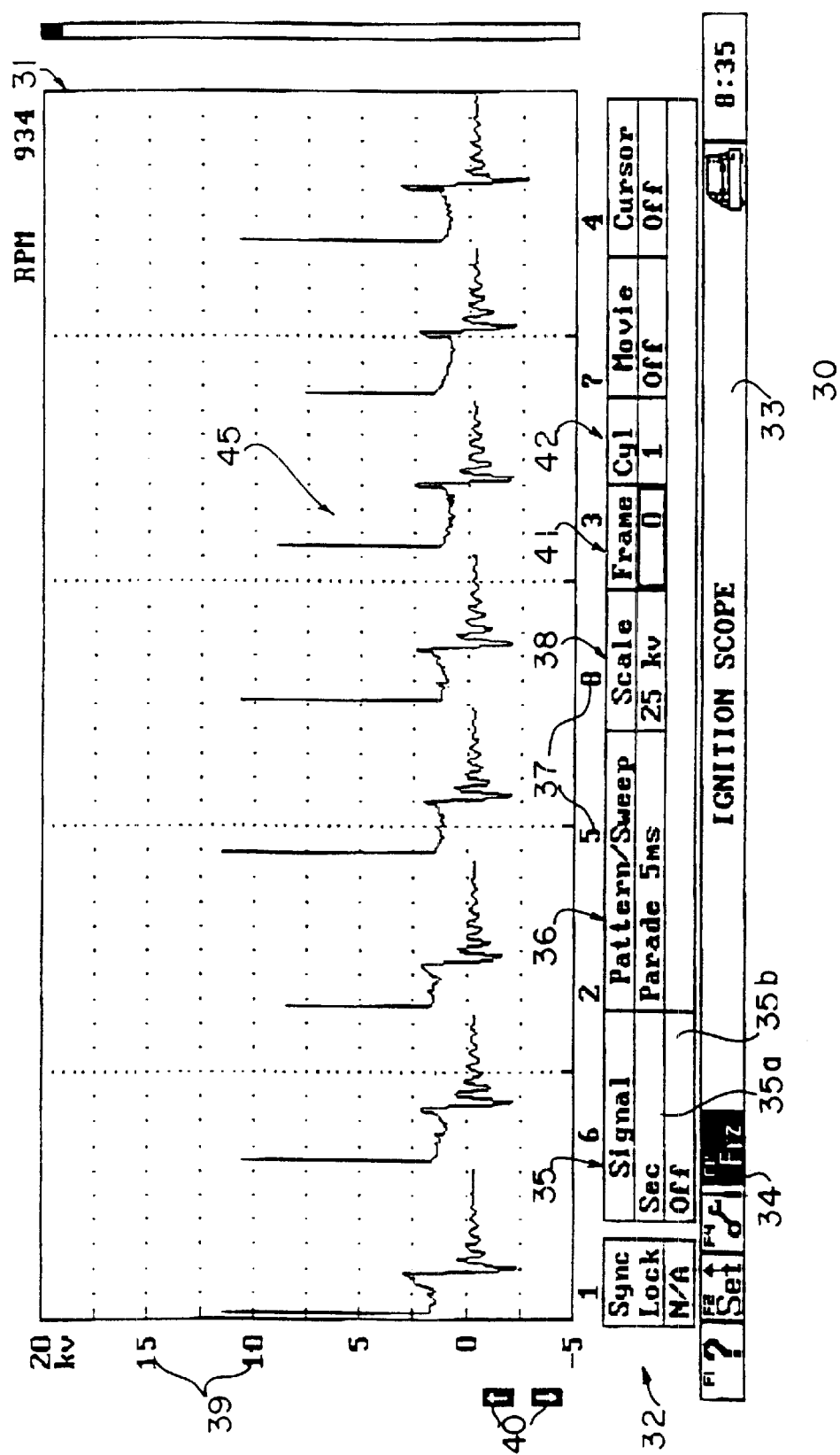
FIG. 2 is a frozen screen display format obtainable with the analyzer of FIG. 1.

Referring now to FIG. 2, there is illustrated a screen display which is one of a number of screen displays available with the engine analyzer 20 which will be useful for explaining the significant aspects of the invention. The screen display of FIG. 2 is set up in a single-trace screen display format 30, so that it has a single rectangular waveform plot area 31 for displaying a waveform along a horizontal axis or trace. Displayed below the waveform plot area 31 is a control panel area 32 including a number of icons and indicators in the nature of rectangular boxes in which text or other indicia may be displayed, the boxes being arranged in horizontal rows. In the lowermost row is a scope mode indicator 33, which indicates the selected scope mode. In this case the indicated mode is "Ignition Scope", which is typically used for displaying primary and secondary ignition waveforms. An engine sweep is always used in the Ignition Scope mode.

There is also provided a Freeze icon 34 which, when highlighted (i.e., displayed with changed colors) as in FIG. 2, selects the Freeze display mode. In this mode data acquisition is suspended and the most recently-displayed section of waveform data remains "frozen" on the screen.

The control panel area 32 also includes a Signal icon 35 which includes boxes 35a and 35b for respectively indicating the signals displayed in the two possible traces of the dual-trace display scope. In each of these boxes, the user can select from among a plurality of different signal options which, respectively, correspond to different ones of the signal pickup leads 22. In this case, the signal displayed on the first trace is the signal appearing on the secondary pickup lead. For the box 35b, one of the available options is "OFF". When this option is selected, as in FIG. 2, the second trace is OFF so that the scope is operating in a single-trace mode. Another option which is available for box 35b is "LIB", which indicates "library", and which will be explained more fully below.

There is also a Pattern/Sweep icon 36 which indicates the selected sweep, in this case a parade 5 ms engine sweep. As was indicated above, since the Ignition Scope display mode has been selected, only engine sweeps are used. Cylinder indicia 37 indicating the different cylinder cycles of the secondary waveform are displayed across the bottom of the waveform plot area 31 in the firing order for the particular engine under test.

There is also provided a Scale icon 38 which indicates the scale of the plot area 31 along the vertical axis. In this case, a 25-kv scale has been selected. Accordingly, scale indicia 39 are arranged in 5-kv increments along the left-hand side of waveform plot area 31. In this case, it will be noted that the zero level of the scale is set so that the scale goes from −5 kv to +20 kv. The location of this zero level, known as the scale offset, can be selectively changed by the use of control arrows 40, as will be explained more fully below.

There is also provided a Frame icon 41 which is used to select the frame of waveform data currently displayed on the screen. In this regard, input waveform data is managed in units which are herein referred to as "frames", the meaning of which term may depend upon the type of sweep (time scale) selected for the scope display. For engine sweeps, a frame represents input waveform data for a complete engine cycle, even though only a single cylinder may be currently displayed on the screen. For fixed-time sweeps, a frame represents waveform data for the period of time corresponding to a single screen width. When the Freeze mode is activated integer frame numbers are assigned to all saved data frames. Zero is assigned to the most recently displayed frame, preceding frames being assigned incrementally larger negative numbers.

Since the Ignition Scope mode has been selected in FIG. 2, the control panel area 32 includes a Cylinder icon 42, which may function as a switch, as explained more fully below, or simply as an indicator. In this case, since a parade 5 ms sweep has been selected, the Cylinder icon 42 is acting simply as an indicator, the indicated cylinder, no. "1" in this case, signifying the starting cylinder in the display, i.e., the cylinder in which the display is triggered, which is fixed in the case of a Cylinder sweep, discussed below, the Cylinder icon 42 indicates the particular cylinder of the displayed frame which is being displayed in the trace.

Each of the icons in the screen display 30 represents a switch which can be controlled by the keyboard 28 and/or the mouse 29. In particular, each of the icons 35, 36, 38, 41 and 42 has associated with it a list of a plurality of switch options. Each switch can assume only one of these options at a given time. There is an indicium associated with each switch option. For the icons 35, 36, 38, 41 and 42, the icon box with respect to which a selection is to be made is first activated or emphasized, emphasis being indicated by a thickened or brightened border around the box. Thus, in FIG. 2 the Frame icon 41 is emphasized. With the keyboard 21, the arrow keys are used to shift the emphasis to the appropriate box and then the "+" and "−" keys are used to index forwardly and rearwardly through the available options within the emphasized box. With the mouse 22, the mouse cursor (arrow 43) is placed on a non-activated box and the mouse is clicked to activate and emphasize the box. Then, each subsequent click of the mouse indexes forward one option through the options associated with the emphasized box.

When the operator desires to select the Freeze display mode, he highlights the Freeze icon 34 by using the F11 function key on the keyboard 28 or by clicking the mouse 29 on the Freeze icon 34.

There is no icon for scale offset, so its switch is hidden. Scale offset is changed by placing the mouse cursor on an arrow 40 and clicking the mouse 29 or by use of the "page up" and "page down" keys on the keyboard 28.

Normally, each of the icons 36, 38, 41 and 42 includes vertically arranged boxes respectively corresponding to the two possible traces on the scope, as in the case of the Signal icon 35. However, in this case, since the second trace is OFF, the boxes corresponding to the second trace are not displayed.

There is plotted in the waveform plot area 31 a waveform 45 which, in this case, is a secondary signal displayed with a parade 5 ms sweep on a 25-kv scale. The waveform 45 is stored as frame "0", as indicated by the Frame icon 41, which indicates that the waveform 45 is the waveform frame which was being displayed in live mode at the time the Freeze mode was entered, and the icon switch settings for that display are also frozen in the screen display format 30.

It is a significant aspect of the present invention that, in the Freeze mode, the engine analyzer 10 utilizes a number of storage registers for keeping track of certain parameters of the frozen screen display format, viz., the settings for each of the Signal icon 35, the Pattern/Sweep icon 36, the Scale icon 38, the Cylinder icon 42 and the scale offset for each trace which is displayed in the frozen screen display format. The registers are arranged in sets and defined below:

Set (1) Initial_sig1, Initial_sig2

Figure 13:
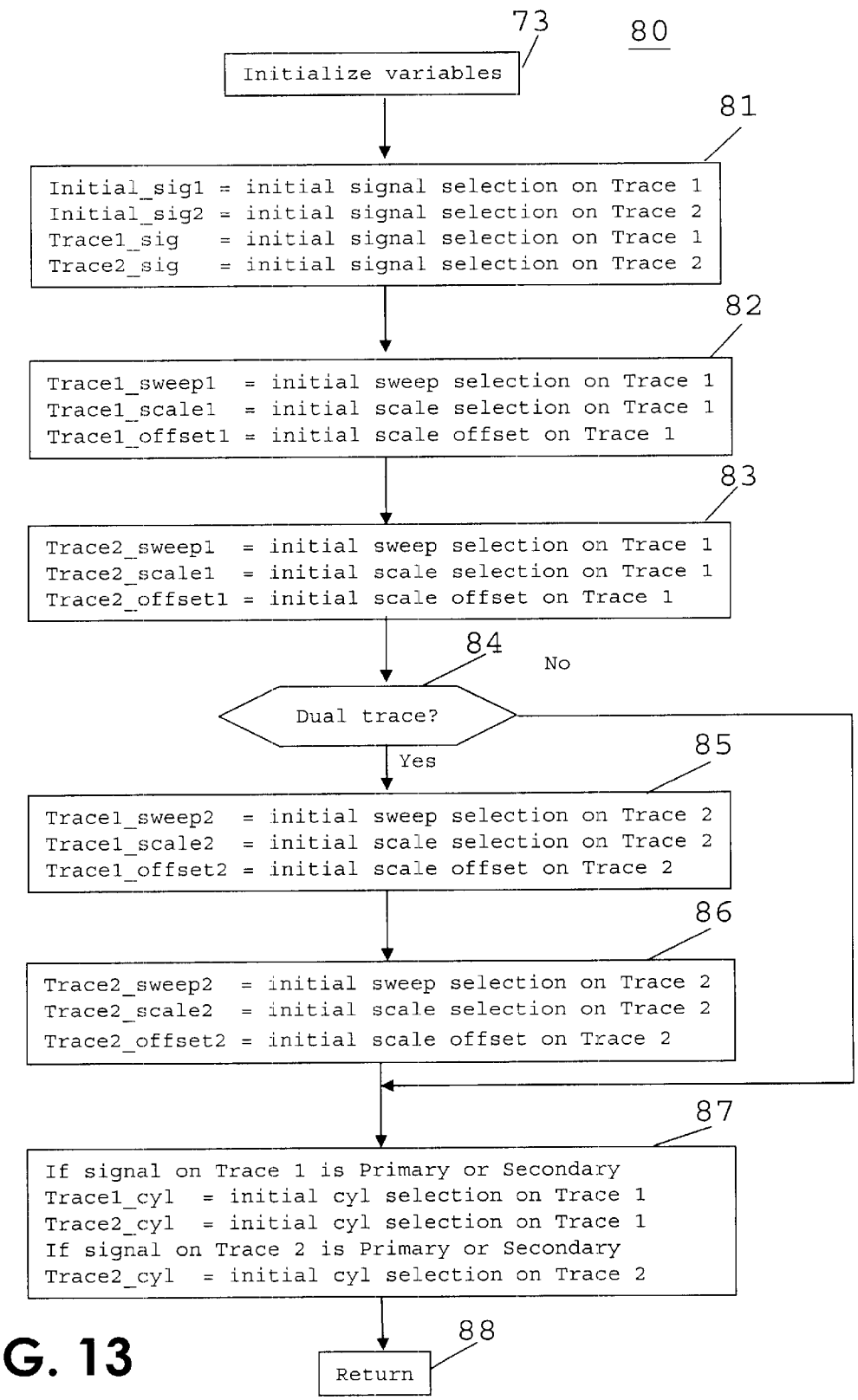

These two registers record the initial signal selection on trace 1 and trace 2, respectively. These registers are initialized at the start of the Freeze mode, as shown in FIG. 13.

Set (2) Trace1_sweep1, Trace1_scale1, Trace1_offset1

This set of registers tracks sweep, scale, and scale offset for the initial signal on trace 1 (Initial_sig1) whenever it is selected on trace 1. For example, if Primary was initially selected on trace 1, in Freeze mode these registers will be used whenever Primary is selected on trace 1. At the start of Freeze mode, these registers are initialized to the current settings on trace 1, as shown in FIG. 13.

Set (3) Trace2_sweep1, Trace2_scale1, Trace2_offset1

This set of registers tracks sweep, scale, and scale offset for the initial signal on trace 1 (Initial_sig1) whenever it is selected on trace 2. For example, if Primary and Secondary were initially selected on trace 1 and trace 2, respectively, in Freeze mode these registers will be used whenever Primary is selected on trace 2. At the start of Freeze mode these registers are initialized to the current setting of Trace 1, as shown in FIG. 13.

Set (4) Trace1_sweep2, Trace1_scale2, Trace1_offset2

This set of registers tacks sweep, scale, and scale offset for the initial signal on trace 2 (Initial_sig2) whenever it is selected on trace 1. For example, if Primary and Secondary were initially selected on trace 1 and trace 2, respectively, in Freeze mode these registers will be used whenever Secondary is selected on trace 1. At the start of Freeze mode these registers are initialized to the current setting of trace 2, as shown in FIG. 13.

Set (5) Trace2_sweep2, Trace2_scale2, Trace2_offset2

This set of registers tracks sweep, scale, and scale offset for the initial signal on trace 2 (Initial_sig2) whenever it is selected on trace 2. For example, if Primary and Secondary were initially selected on trace 1 and trace 2, respectively, in Freeze mode these registers will be used whenever Secondary is selected on trace 2. At the start of Freeze mode these registers are initialized to the current setting of trace 2, as shown in FIG. 13.

Set (6) Trace1_cyl, Trace2_cyl

In Ignition Scope mode these two registers record the cylinder selection on trace 1 and trace 2, respectively. At the start of Freeze mode these registers are set to the cyl selection on trace 1 and trace 2. If the signal on trace 2 is initially OFF or LIB, Trace2_cyl is set to the cylinder selection on trace 1, as shown in FIG. 13.

In other words, the registers record not only the initial Signal selection and the Cylinder selection for each trace, but also record, for each trace, the display parameter settings for the signal (if any) initially displayed on that trace, as well as the settings for the signal (if any) displayed on the other trace. As will be explained fully below, this permits the user to reconfigure the frozen screen display format by changing the signal displayed on a particular trace.

In accordance with the present invention, the frozen screen display format can be reconfigured by the user in the following ways:

A. Changing Signal Selection (see FIG. 15)

The signal selection on trace 1 can be modified only if two different signals have been captured in live mode. This is true if the scope was initially in dual-trace, the initial trace 2 signal setting was not Library, and the signal on trace 2 was different from the signal on trace 1. If these conditions are met, then either of the captured signals can be displayed on trace 1.

The signal selected on trace 2 can be the initial signal on trace 1, the initial signal on trace 2, LIB, or OFF. Library can be selected on trace 2 only if the scope mode selected is Ignition Scope or Sensor Test (not shown). The OFF selection puts the scope in single-trace mode.

Whenever the user modifies the signal selection (on trace 1 or 2), the sweep, scale, and scale offset are automatically modified in accordance with the newly selected signal. The new settings are obtained from the applicable storage registers which were described above.

B. Changing Sweep Selection (see FIG. 16)

Figure 16:
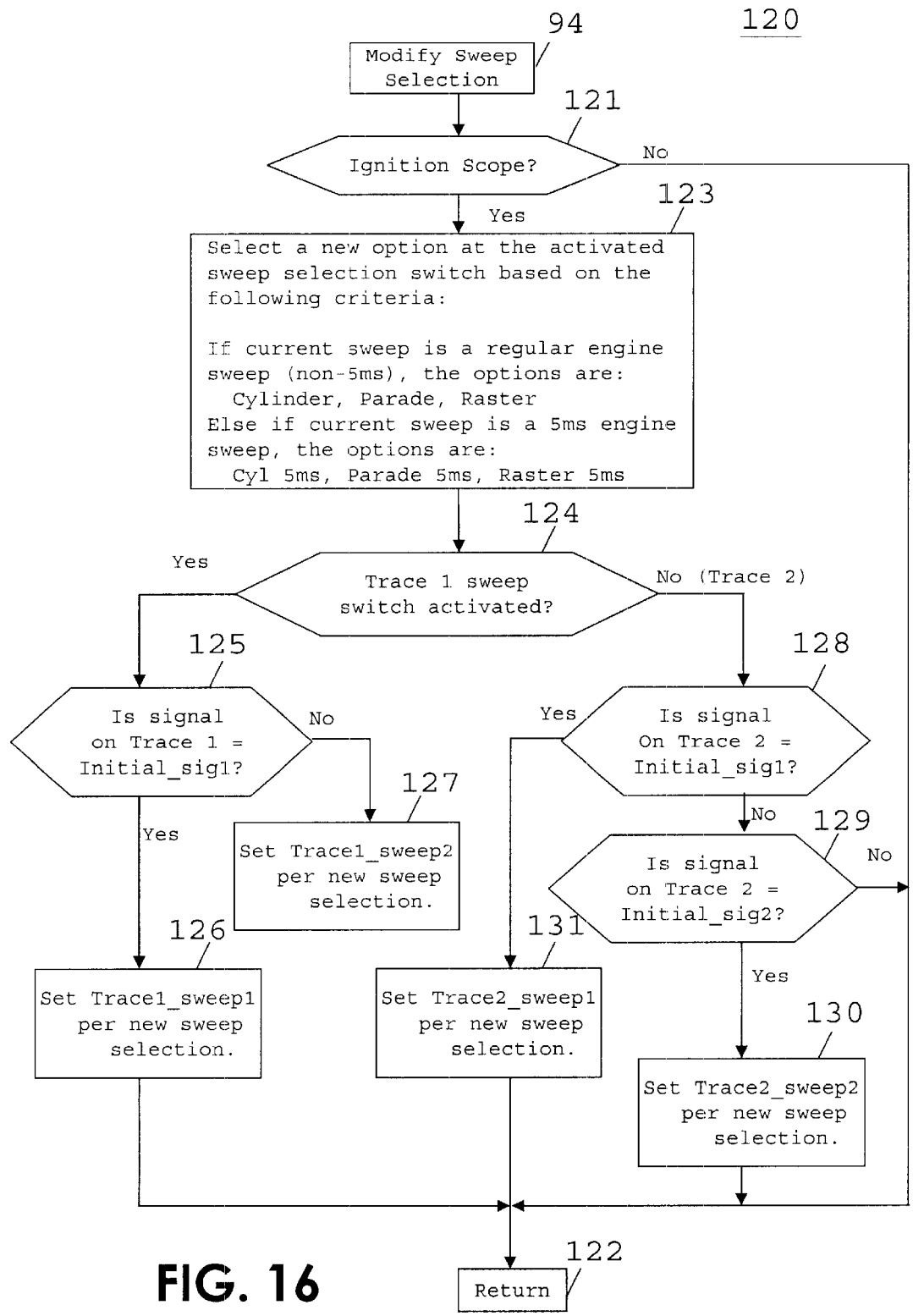

In Ignition Scope mode the sweep selection can be modified in Freeze mode. Based on the initial sweep selection, three options are available. If the initial sweep is Cylinder, Parade, or Raster, the new selection must be Cylinder, Parade, or Raster. If the initial sweep is Cylinder 5 ms, Parade 5 ms, or Raster 5 ms, the new selection must be Cylinder 5 ms, Parade 5 ms, or Raster 5 ms. Thus, the new sweep selection must be of the same type as the initial sweep selection. This restriction is enforced by the scope by offering only the valid options to the user, as indicated in FIG. 16. FIG. 16 also shows how the proper storage register is selected and updated with the new sweep selection.

C. Changing Scale Selection (see FIG. 17)

Figure 17:
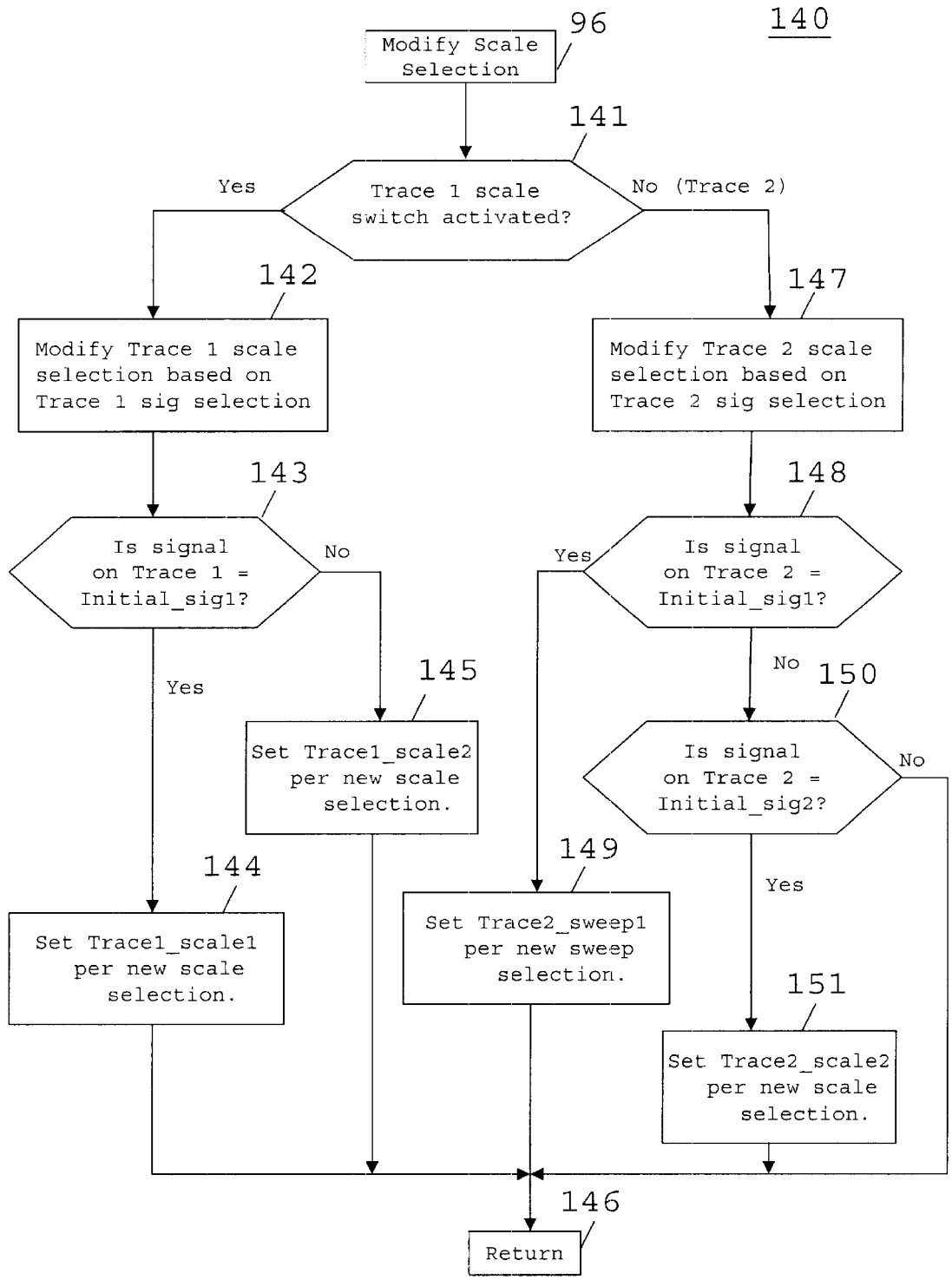

The scale selection can be modified in FIG. 17 in accordance with the scales available for the selected signal. FIG. 17 also shows how the proper storage register is selected and updated with the new scale selection.

D. Changing Scale Offset (see FIG. 18)

Figure 18:
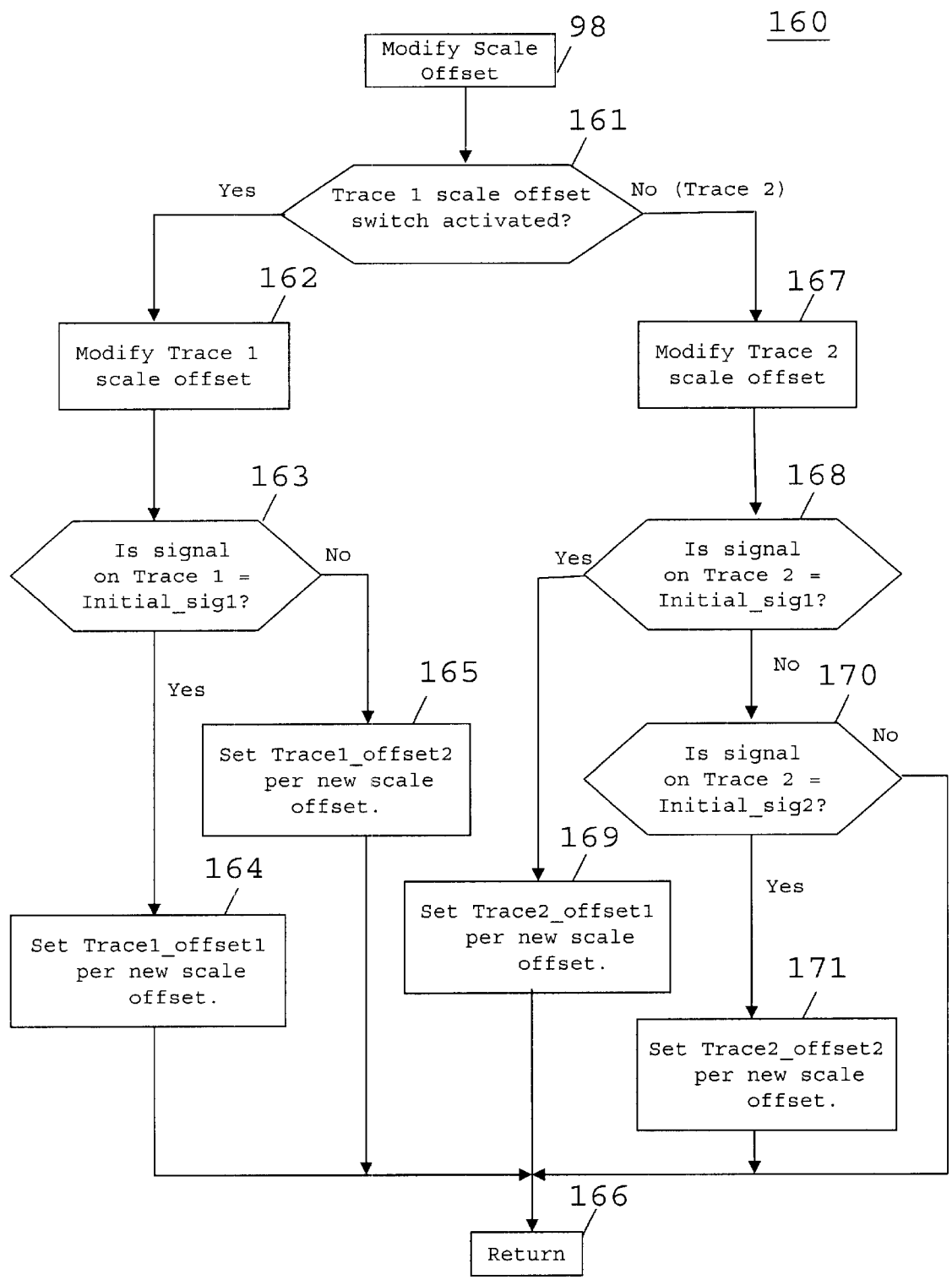

The scale offset can be modified in Freeze mode. FIG. 18 shows how the proper storage register is selected and updated with the new scale offset selection.

E. Changing Cylinder Number (see FIG. 19)

Cylinder number can be modified if the sweep is Cylinder or Cylinder 5 ms. For other types of sweeps the cylinder selection switch cannot be activated and therefore the routine in FIG. 19 will never be called.

Figure 3:
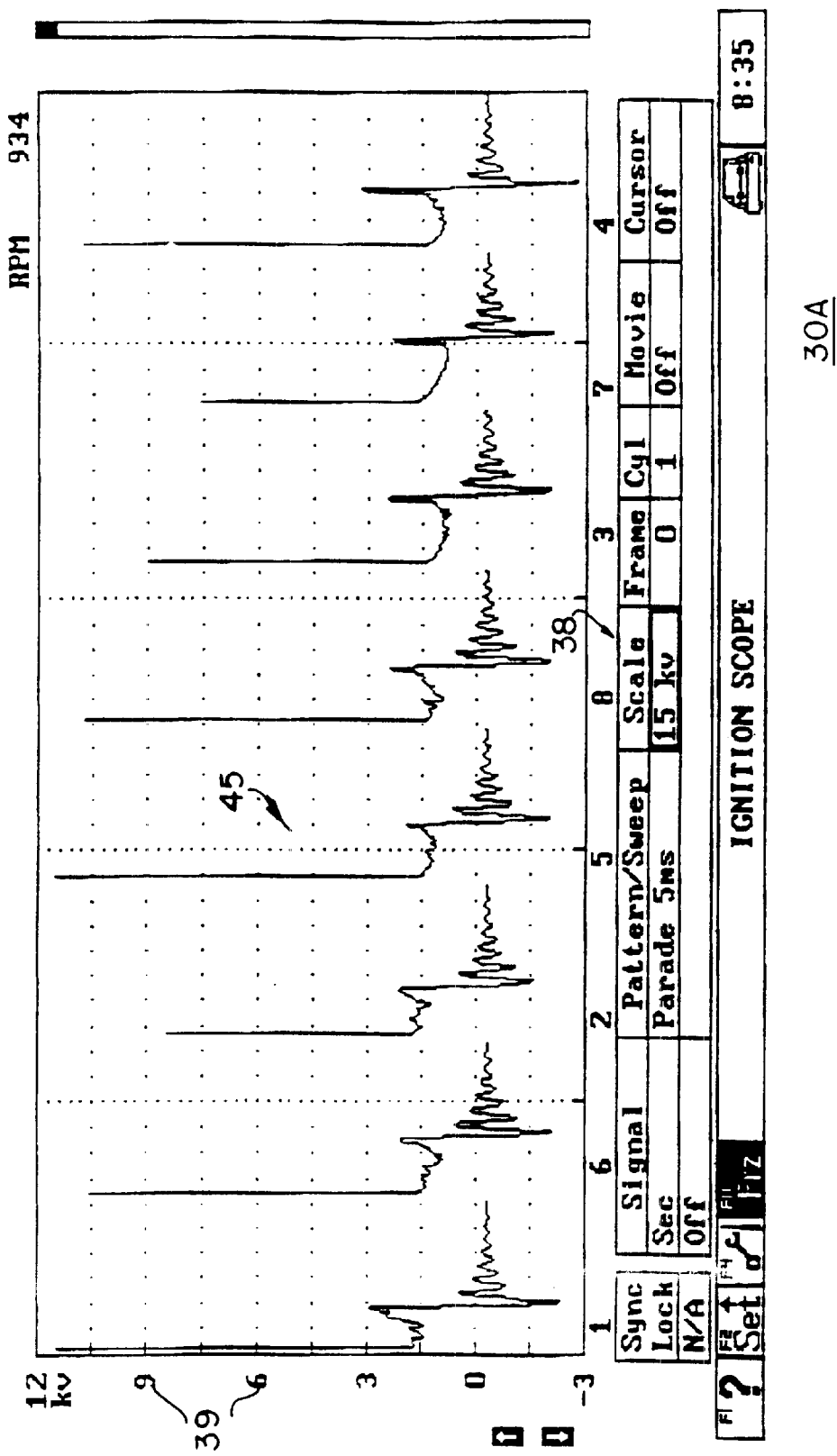
FIGS. 3 and 4 are reconfigured forms of the screen display format of FIG. 2, altered in accordance with the present invention.

Referring to FIG. 3, there is illustrated a screen display format 30A, which is substantially identical to that shown in FIG. 2, except that in this case the user has reconfigured the display format to display the waveform 45 on a different scale, viz., a 15-kv scale, as indicated by the Scale icon 38 and the scale indicia 39. The user makes this modification by activating the Scale icon 38 and indexing through the available scale options until the 15-kv option is reached. All of the other parameters of the screen display format 30 remained unchanged in the format 30A.

Figure 4:
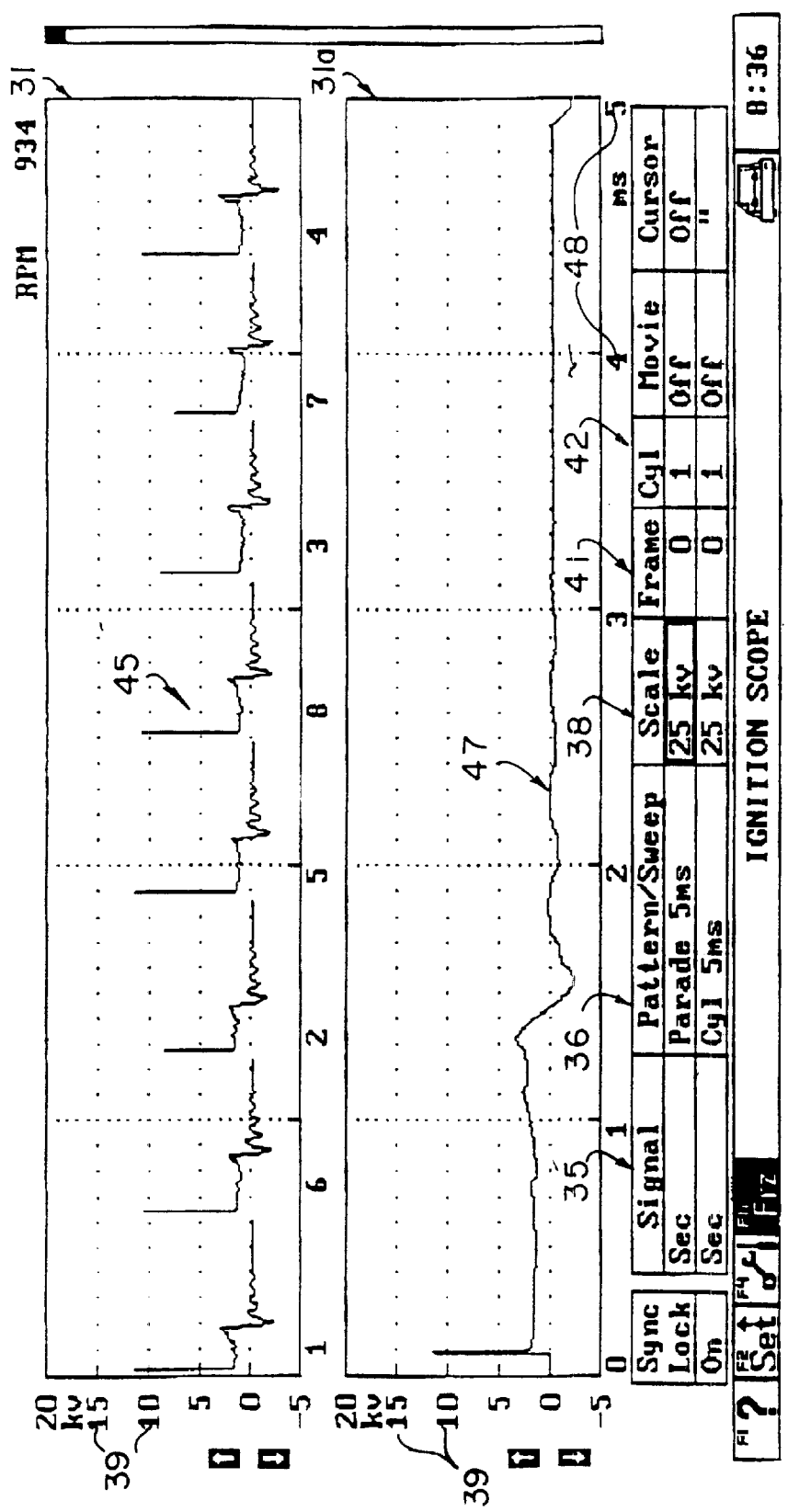

Referring to FIG. 4, there is illustrated a screen display format 46 which is another reconfiguration of the frozen screen display format 30 of FIG. 2. In this case, the operator has changed the display to a dual-trace format, the two traces (referred to herein as "trace 1" and "trace 2") being displayed, respectively, in two discrete waveform plot areas 31 and 31a. Since only a single signal, i.e., the secondary ignition signal, was captured or acquired in the live mode at the time the Freeze mode was entered, only that one signal is available for display. Thus, the user shifts the format to dual-trace by activating the Signal icon box 35b and indexing through the available options until the SEC option is reached. As soon as the switch for the icon box 35b moves from the OFF option, the scope will immediately go into dual-trace mode and the waveform plot areas 31 and 31a will appear, and the original waveform 45 will be plotted in trace 1 and the newly selected signal will appear on trace 2, initially with the same display parameters that it had in live mode, unless and until one of those parameters is changed by the operator. At the same time the trace 2 boxes for the icons 36, 38, 41 and 42 will appear. In the case of FIG. 4, the trace 2 sweep option has been changed to a cylinder 5 ms sweep. Thus, only a single cylinder of the waveform 45 is plotted on trace 2, as waveform 47. Since only a single cylinder is displayed, the cylinder indicia 37 of trace 1 have been replaced by fixed-time scale indicia 48 in 1 ms increments. By default, when a cylinder sweep is selected, the no. 1 cylinder is displayed as indicated by the Cylinder icon 42, but this can also be altered by the operator.

Figure 5:
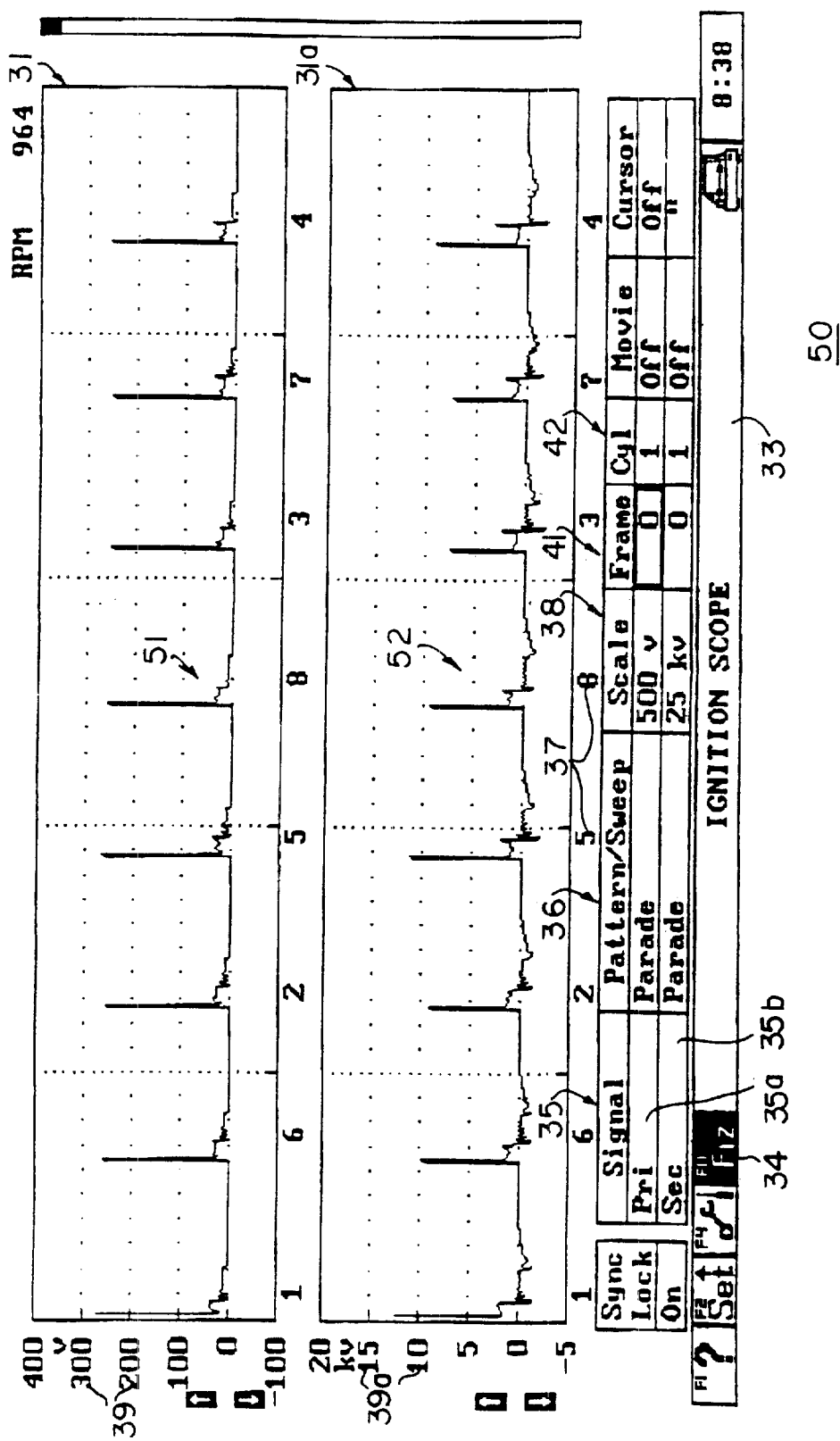
FIG. 5 is a frozen dual-trace screen display format obtainable with the engine analyzer of FIG. 1.

Referring to FIG. 5, there is illustrated a screen display format 50 which is, again, as initially frozen (note that frame "0" is indicated as being displayed in Frame icon 41), but in this case the frozen screen display is initially in dual-trace mode with two different signals respectively displayed on the two traces. More specifically, a primary ignition signal is displayed on trace 1 as waveform 51, and a secondary ignition signal is displayed on trace 2 as waveform 52, as indicated by the Signal icon 35. Both of the waveforms 51 and 52 are displayed in a parade sweep, as indicated by the icon 36 and, accordingly, cylinder indicia 37 are displayed beneath the waveform plot areas 31 and 31a. The Scale icon 38 indicates that the trace 1 waveform 51 is displayed on a 500-volt scale, as indicated by the scale indicia 39, while the trace 2 waveform 52 is displayed on a 25-kv scale, as indicated by the scale indicia 39a.

Figure 6:
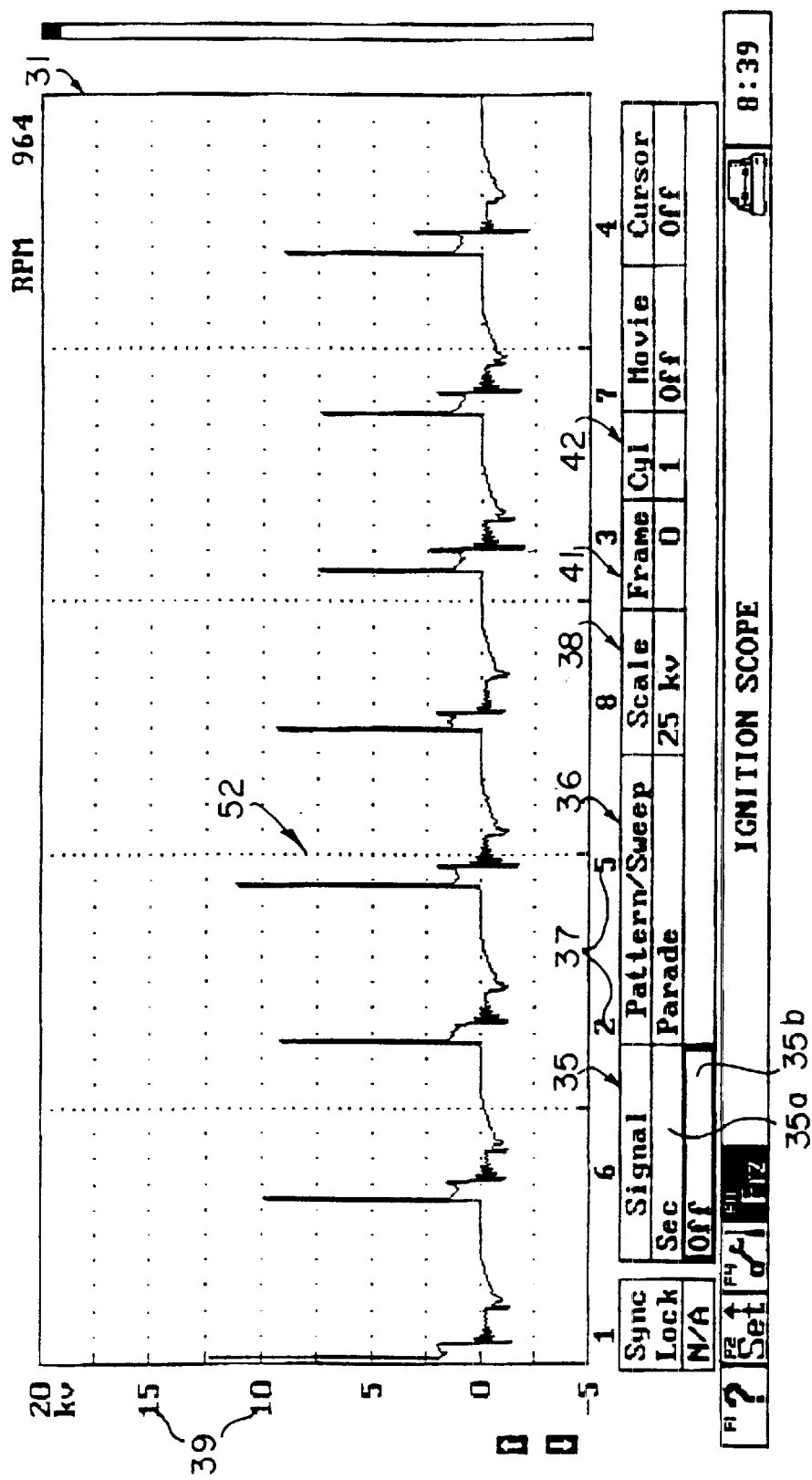
FIGS. 6–8 are reconfigured versions of the screen display format of FIG. 5, modified in accordance with the present invention.

In FIG. 6, there is illustrated a screen display format 50A which is a reconfigured version of that shown in FIG. 5. In this case, the operator has reconfigured the frozen display format to a single-trace mode by changing the Signal switch option for trace 2 to OFF, as indicated in the icon box 35b. Also, the signals have been changed, by displaying the secondary signal 52 on trace 1, which is the only trace now displayed, as indicated in the icon box 35a. The other display parameters for the secondary signal as originally displayed in FIG. 5, remain unchanged in FIG. 6, but the screen resolution has increased, since the 25-kv scale is now being arranged over a single waveform plot area 31 having approximately twice the height of the trace 1 waveform plot area 31 in the dual-trace format of FIG. 5.

Figure 7:
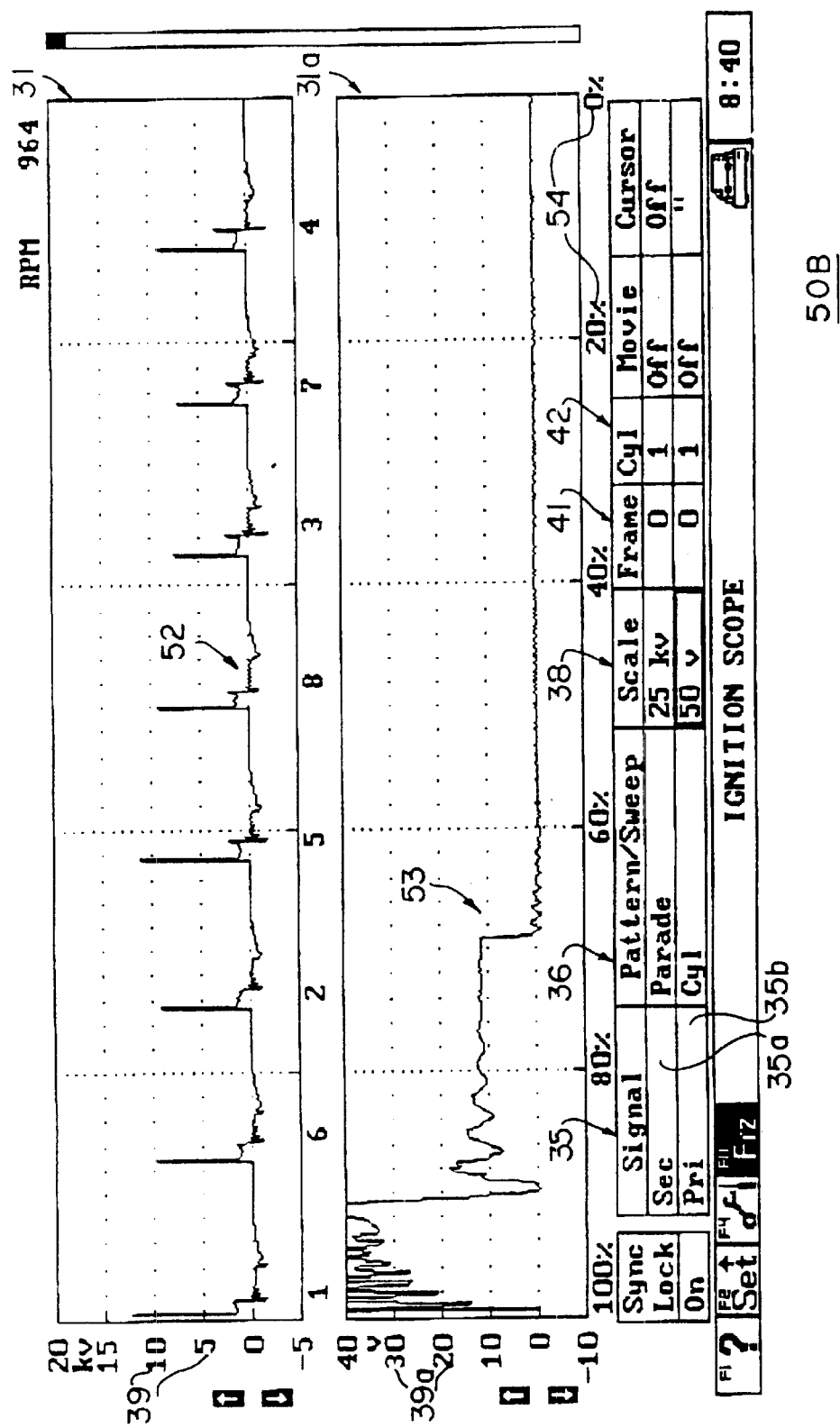

FIG. 7 illustrates a screen display format 50B which is another reconfigured version of the frozen screen display format 50 of FIG. 5. In this case the primary and secondary signals have been swapped between trace 1 and trace 2, so that waveform 52 is now displayed on trace 1, as indicated by the Signal icon 35. All of the other display parameters for the waveform 52 remain unchanged from the FIG. 5 settings. The primary signal, now displayed on trace 2 has, however, been further altered to a cylinder sweep, so that only a single cylinder is now displayed as a waveform 53 and, accordingly, indicia 54 are displayed indicating the percent of the cylinder cycle in 20% increments. Also, the scale of the primary signal display has been changed from 500 volts to 50 volts, as indicated by the Scale icon 38 and the Scale indicia 39a. Swapping the signals on traces 1 and 2 in this manner permits comparison of the signal originally on trace 1 with a library pattern, as is explained below.

Figure 8:
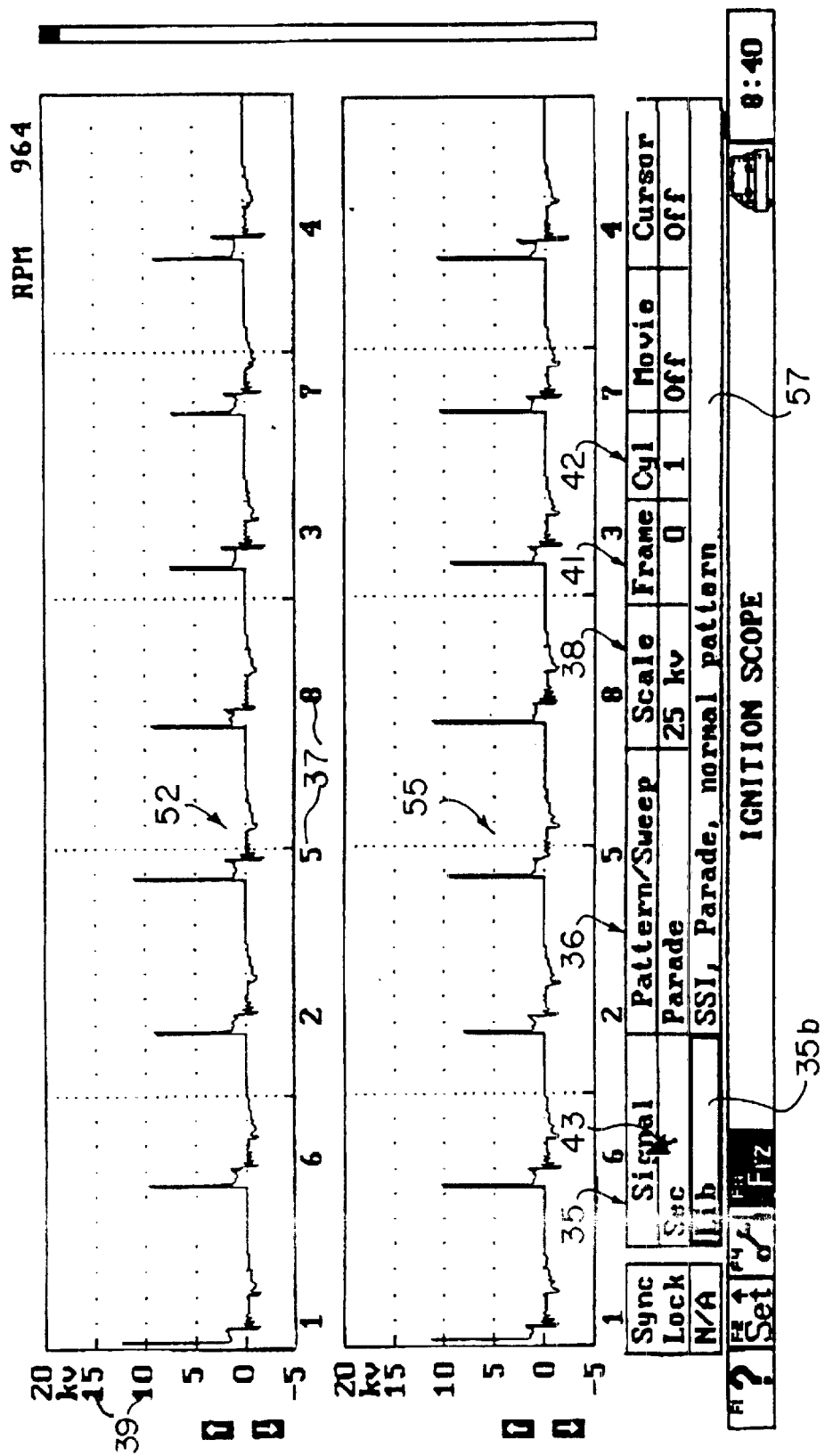

In FIG. 8, there is shown a screen display format 50C which is a further reconfigured version of the screen display format 50B of FIG. 7. In this case the signal on trace 2 has been changed to a library pattern 55, as indicated in the icon box 55b. The library signal selection is available only on trace 2 and, preferably, the analyzer 20 is provided with programming such that the system automatically selects from the library a pattern which is related to the waveform displayed in trace 1. Since the display parameters for the library pattern are predetermined, the trace 2 icon boxes for the icons 36, 38, 41 and 42 are replaced by an indicator 57 which describes the library pattern displayed on trace 2.

Figure 9:
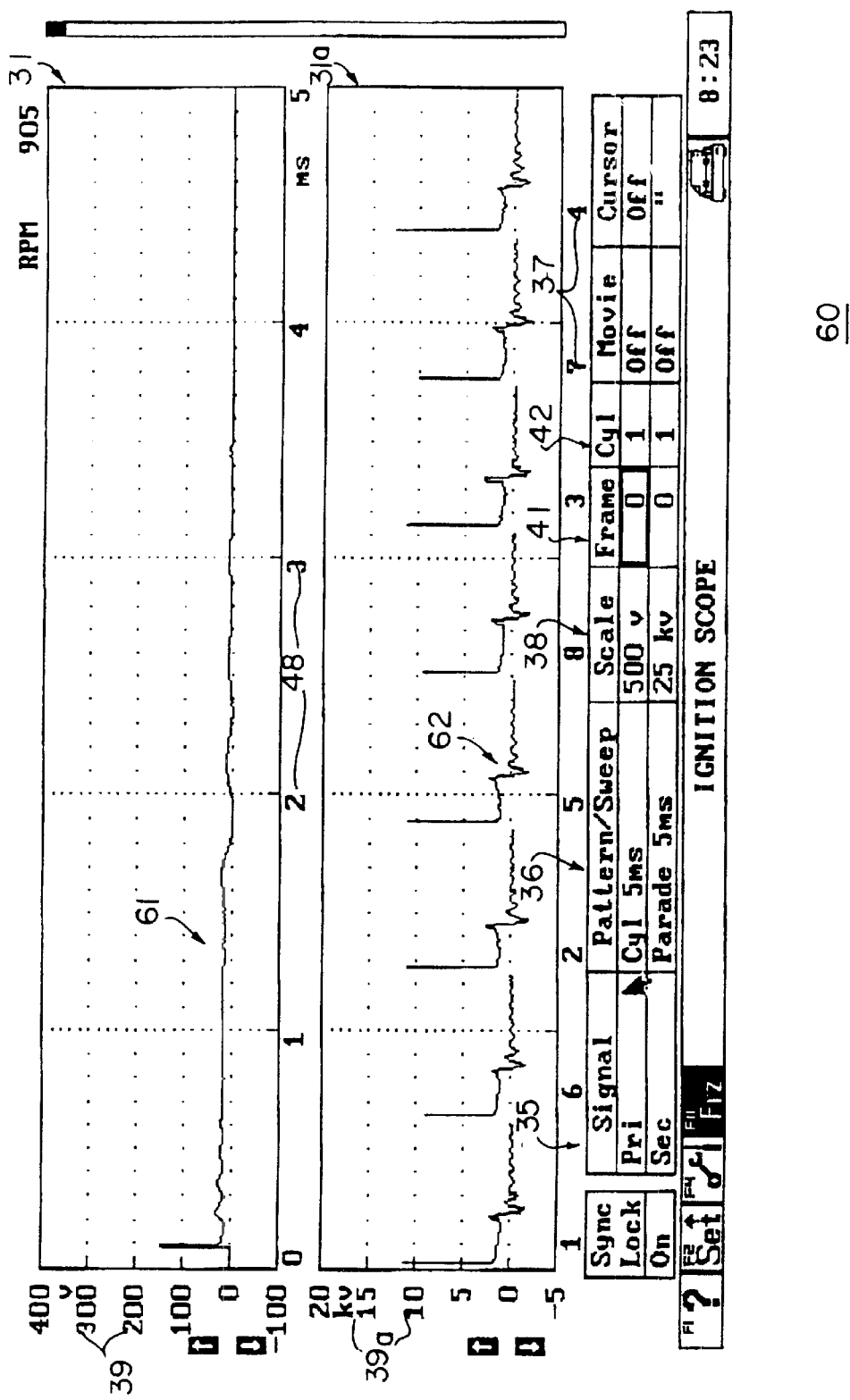
FIG. 9 is another frozen dual-trace screen display format obtainable with the engine analyzer of FIG. 1.

Referring now to FIG. 9, there is illustrated a screen display format 60, which shows the last-displayed live waveform and screen configuration, as indicated by the frame selection being at "0" in the Frame icon 41. This display pattern is in dual-trace format with a primary signal being plotted as waveform 61 on trace 1 with a cylinder 5 ms sweep on a 500-volt scale, and with a secondary signal being plotted on trace 2 as a waveform 62 in parade 5 ms sweep on a 25-kv scale.

Figure 10:
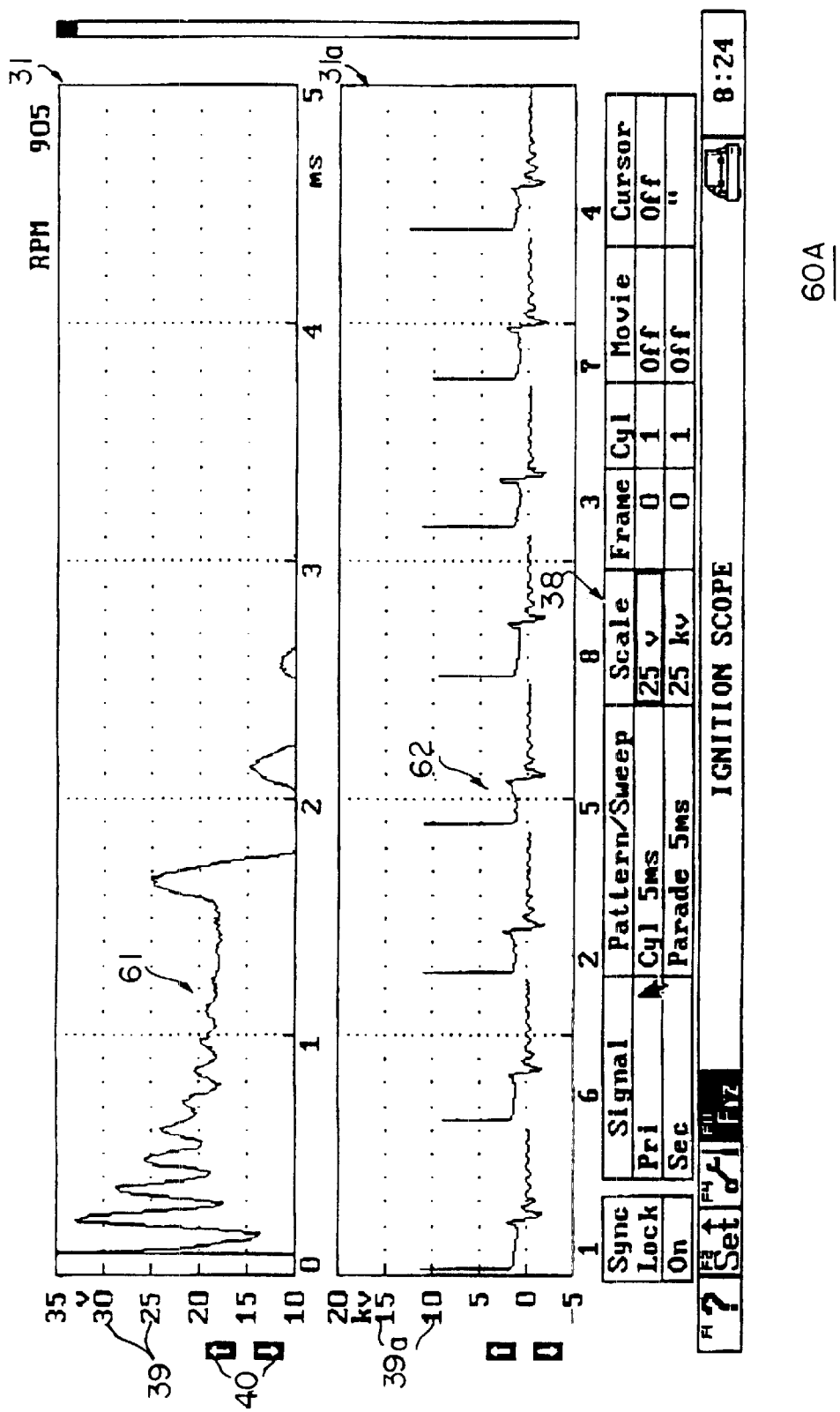
FIGS. 10 and 11 are reconfigured versions of the screen display format of FIG. 9, altered in accordance with the present invention.

FIG. 10 illustrates a screen display format 60A, which is a reconfigured version of the frozen format of FIG. 9. In this case the trace 2 display remains unchanged, but the scale has been changed on trace 1 to a 25-volt scale, as indicated in the Scale icon 38 and by the scale indicia 39. Also, the scale offset has been changed on trace 1 so that the zero point is off the waveform plot area 31 and the scale indicia run from 10 volts to 35 volts in 5-volt increments. As was indicated above, this shift of scale offset point is effected by clicking the mouse cursor on the appropriate one of the scale arrows 40, with each click indexing the zero point up or down one scale division (5 volts in this case).

Figure 11:
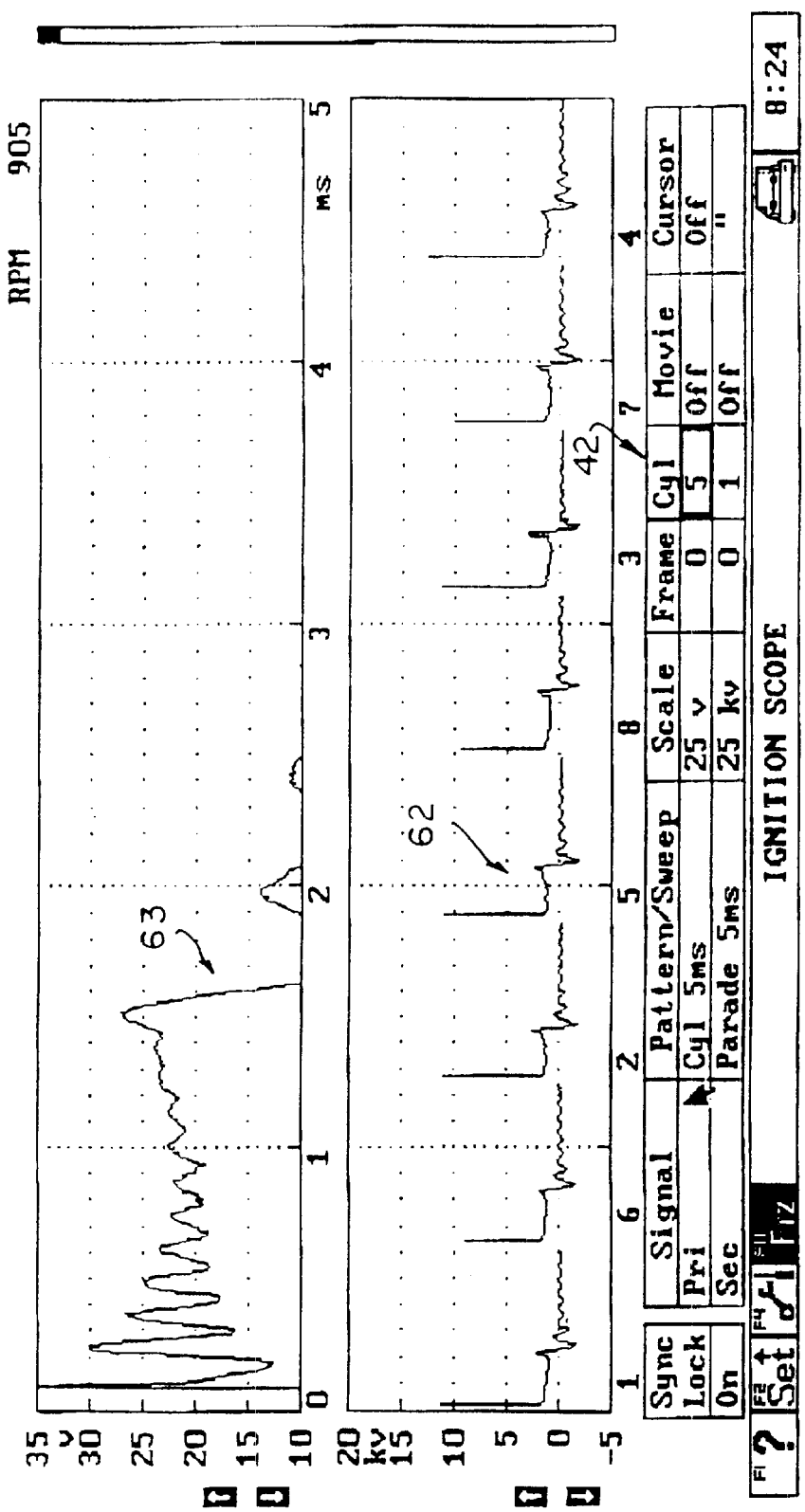

FIG. 11 shows a screen display format 60B, in which the format 60A has been further modified in that a different cylinder, viz., cylinder 5, has been selected for display on trace 1, as indicated by the Cylinder icon 42, this cylinder being displayed as waveform 63. All of the other display parameters for traces 1 and 2 remain the same as in FIG. 10.

Referring now to FIGS. 12–20, there are illustrated flow chart diagrams for a software program for establishing the Freeze mode and for reconfiguring a frozen screen display format in the Freeze mode. The main Freeze routine is designated 70 in FIG. 12 and is entered at 71 when the operator selects the Freeze mode by highlighting the Freeze icon 34. The program at 72 initially configures the frozen scope screen to have the same display parameters as in the last-displayed live mode screen, i.e., the same input signal, the same sweep, scale and cylinder selections, as well as the same scale offset. The program then at 73 initializes the variables to be stored in the several Freeze mode registers described above, in accordance with a subroutine described below in connection with FIG. 13. The program then displays the frozen waveform or waveforms at 74 by executing a subroutine which will be described in connection with FIG. 20. Then, at 75, the program processes the control panel area 32 by executing a subroutine to be described below in connection with FIG. 14 and then, at 76, checks to see if the EXIT key has been pressed. If it has, the routine is exited at 77 and, if it has not, the program loops back to 74.

The Initialize Variables subroutine called at 73 is designated 80 in FIG. 13. First, at 81, the routine initializes the set (1) of registers described above to the initial signal selections on traces 1 and 2 and then also defines a Trace1_sig as the initial trace 1 selection and defines Trace2_sig as the initial signal selection on trace 2. Then, at 82 and 83 the program initializes the sets (2) and (3) of registers to the initial display parameters of the initial trace 1 display and then checks at 84 to see if the scope is in a dual-trace mode.

If it is, the program proceeds at 85 and 86 to initialize the register sets (4) and (5) to the parameters for the initial trace 2 display. Then, at 87, if the analyzer 20 is in the Ignition Scope mode, i.e., a primary or secondary signal is being displayed on trace 1, both of the registors of set (6) are initialized to record the initial cylinder selection on trace 1. However, if the trace 2 selection is either primary or secondary the Trace 2_cyl register is set to the initial cylinder selection on trace 2. Then the program returns at 88 to the main routine 70.

Figure 12:
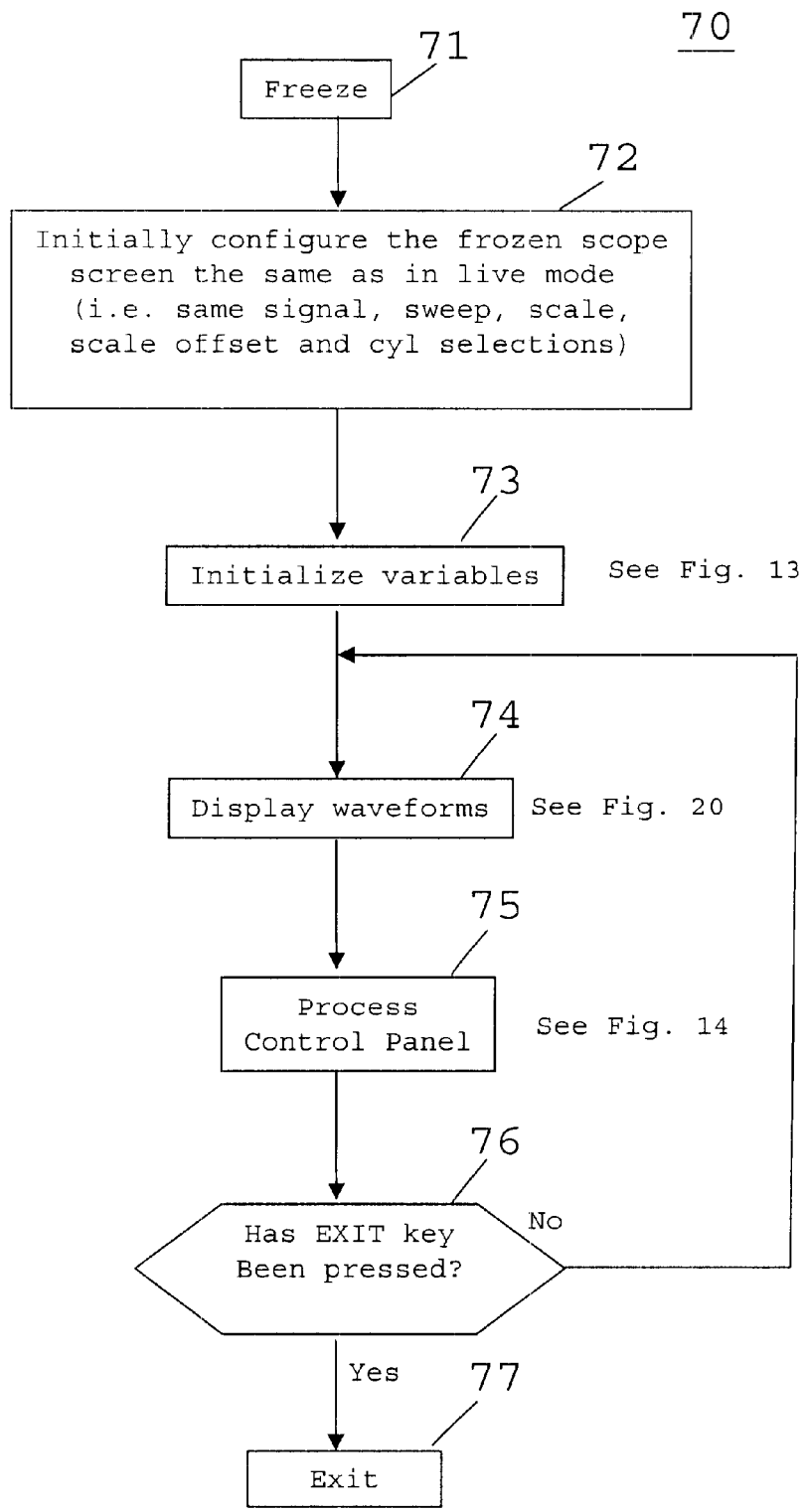
FIGS. 12–20 are flow chart diagrams of a software program for controlling the freeze mode of operation of the engine analyzer of FIG. 1 in accordance with the present invention.
Figure 14:
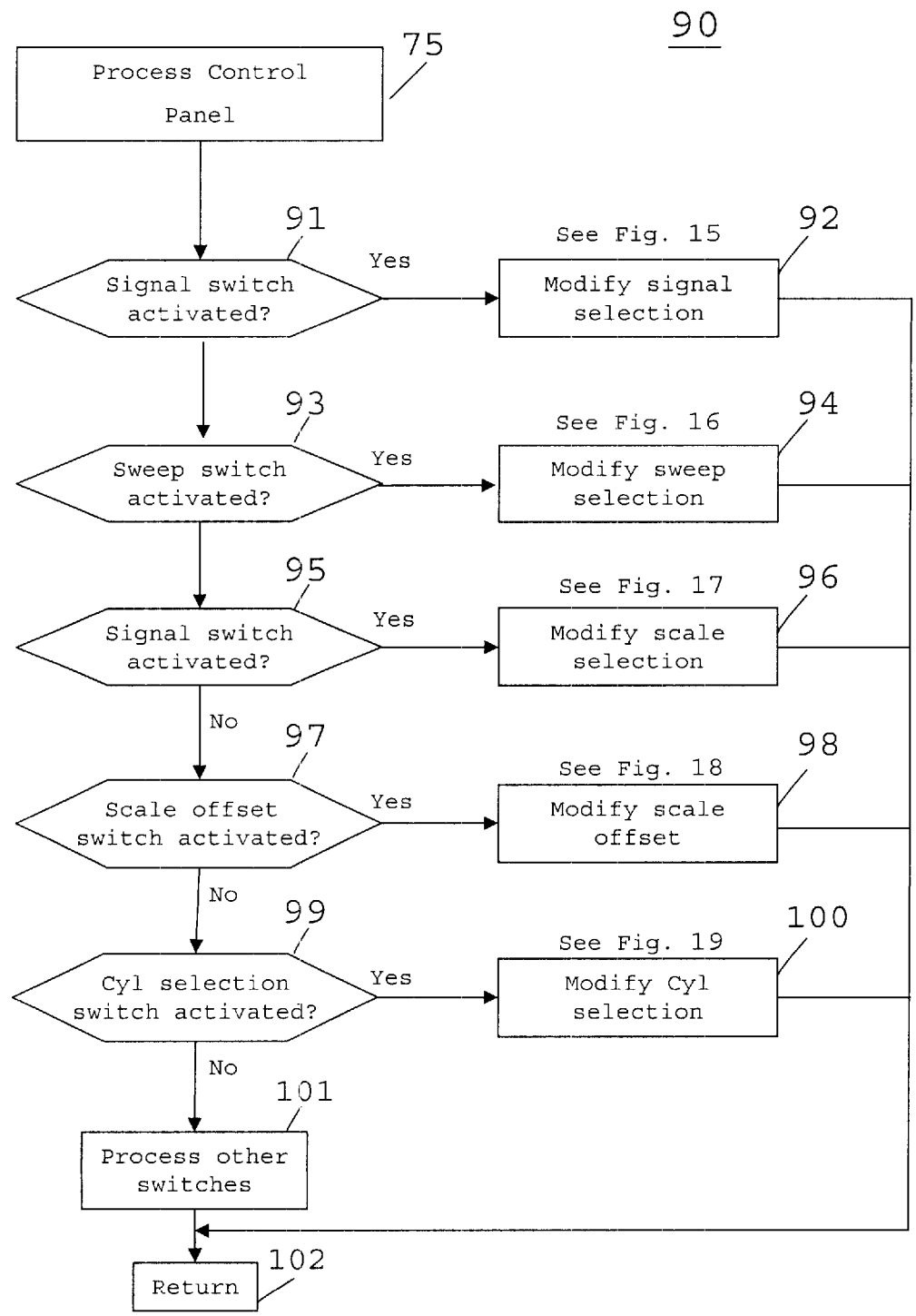

The Process Control Panel subroutine called at 75 of FIG. 12, is designated 90 in FIG. 14. It first checks at 91 to see if the Signal icon switch has been activated and, if so, at 92 it modifies the Signal selection in accordance with the current switch setting by executing a subroutine described below in connection with FIG. 15, and then returns at 102 to the main Freeze routine. If the Signal switch was not activated at 91, the program checks at 93 to see if the Sweep switch was activated. If so, it executes the routine of FIG. 16 at 94 to modify the sweep selection before returning. In like manner, the program continues to check at 95, 97, and 99 to see if the switch selection was any of the Scale, scale offset or cylinder switches and, if so, makes the appropriate modification to the switch setting at 96, 98 or 100 by executing the appropriate one of the subroutines of FIGS. 17, 18 and 19, and then returns.

If none of these switches was activated, the program at 101 processes the other control panel switches before returning at 102.

Figure 15:
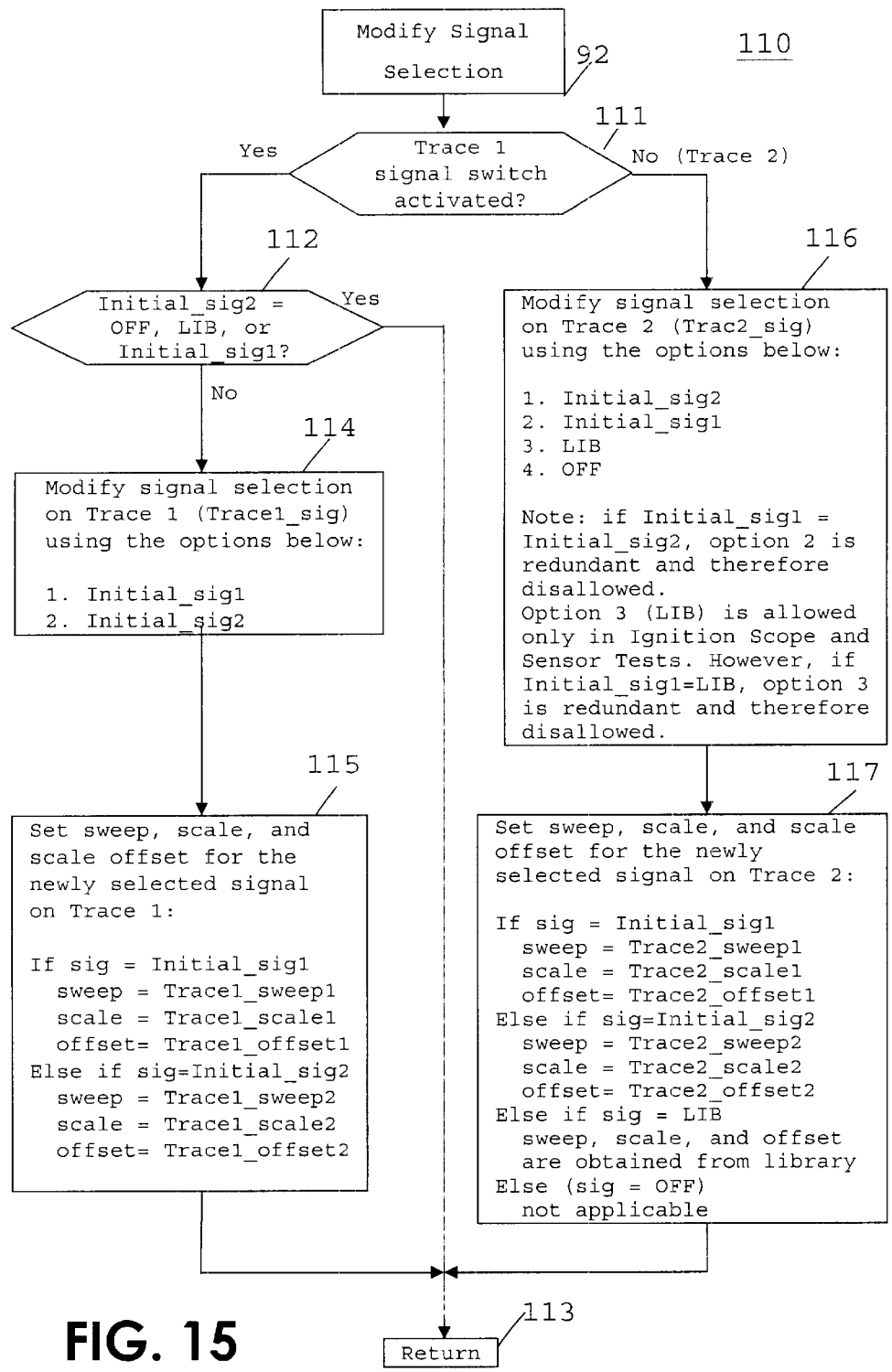

The Modify Signal Selection subroutine called at 92 is set forth at 110 in FIG. 15. The routine first checks at 111 to see if the trace 1 signal switch (icon box 35a) has been activated. If it has, the program then checks at 112 to see if the initial Signal switch selection for trace 2 (icon box 35b) is set to OFF, LIB or to the same setting as trace 1. If so, the program returns at 113 to the Process Control Panel routine of FIG. 14. If the decision at 112 is "no", indicating that trace 2 was initially set to a different input signal than trace 1, then the trace 1 Signal switch selection can be either the initial trace 1 setting or the initial trace 2 setting and, at 114, the program toggles the trace 1 Signal switch selection accordingly. Then, at 115, the program sets the display parameters for the newly selected signal on trace 1 to correspond with the current settings for either trace 1 or trace 2 in accordance with the register sets (2) or (4), described above, and then returns at 113.

If, at 111, the trace 1 Signal switch was not activated, this means that it must have been the trace 2 switch (icon box 35b). Accordingly, the program at 116 modifies the signal selection on trace 2 to the selected one of the available options, viz., the initial signal on trace 1, the initial signal on trace 2, LIB or OFF. Then, at 117, the program sets the display parameters for the newly selected signal on trace 2 in accordance with the register sets (3) or (5), described above, unless the trace 2 signal setting is now at LIB, in which case the parameters are obtained from the library, or unless the trace 2 Signal selection is OFF, in which case display parameters are not applicable. The program then returns at 113.

The Modify Sweep Selection subroutine called at 94 is designated 120 in FIG. 16. The routine at 121 first checks to see if the analyzer is in the Ignition Scope mode. If not, sweep modification is not applicable and the program returns at 122 to the Process Control Panel routine of FIG. 14. If the analyzer is in the Ignition Scope mode, the program next, at 123, selects a new option for the activated sweep selection switch. There are two sets of options available. If the current sweep is a regular engine sweep, the available options are cylinder, parade and raster sweeps. It the initial sweep setting is a 5 ms engine sweep, the available options are cylinder 5 ms, parade 5 ms and raster 5 ms sweeps. Then, at 124, the program checks to see if the trace 1 Sweep switch (icon 36) was activated. If so, the program next checks at 125 to see if the signal currently displayed on trace 1 is the signal initially displayed there when Freeze mode was entered. If so, the program at 126 modifies the sweep parameter register for trace 1 to the new sweep selection and then returns at 122. If, at 125, the signal on trace 1 is not the initial signal displayed there, then it must be the signal initially displayed on trace 2 and, accordingly, the program at 127 sets the Trace 1_sweep2 register to the new sweep selection and then returns.

If, at 124, the trace 1 Sweep switch was not activated, this means that it was the trace 2 switch and, accordingly, the program at 128 checks to see if the signal currently displayed on trace 2 is the signal initially displayed on trace 1. If it is not, the program next checks at 129 to see if it is the signal which was initially displayed on trace 2. If not, the program returns and, if so, the program sets the Trace2_sweep2 register to the new sweep selection and returns. If, at 128, the signal currently displayed on trace 2 is that originally displayed on trace 1, the program at 131 sets the Trace 2_sweep1 register to the new sweep selection before returning.

The Modify Scale Selection subroutine called at 96 in FIG. 14 is designated 140 in FIG. 17. The program first checks at 141 to see if the trace 1 Scale switch (icon 38) is activated. If so, the program at 142 modifies the trace 1 Scale selection based on the trace 1 Signal selection. Then, at 143, the program checks to see if the signal on trace 1 is that which was initially displayed there when the Freeze mode was entered. If it is, the program at 144 sets the Trace1_scale1 register to the new scale selection and then returns at 146. If, at 143, the signal on trace 1 is not that which was initially displayed there, the program at 145 sets the Trace1_scale2 register in accordance with the new scale selection and returns.

If, at 141, the trace 1 Scale switch was not activated, then it must have been the trace 2 switch and, accordingly, the program at 147 modifies the trace 2 Scale selection based upon the trace 2 Signal selection. Then, at 148, the program checks to see if the signal on trace 2 is that which was initially displayed on trace 1. If so, the program sets the Trace2_scale1 register in accordance with the new scale selection and then returns. If, at 148, the signal on trace 2 is not that initially displayed on trace 1, the program at 150 checks to see if it is the signal initially displayed on trace 2. If not, the program returns and, if so, the program at 151 first sets the Trace2_scale2 register in accordance with the new scale selection before returning.

The Modify Scale Offset subroutine called at 98 in FIG. 14 is designated 160 in FIG. 18. The routine first at 161 checks to see if the trace 1 scale offset switch (arrows 40) has been activated. If so, the program at 162 modifies the trace 1 scale offset accordingly and then, at 163, checks to see if the signal on trace 1 is that which was initially displayed there. If so, it sets the Trace1_offset1 register in accordance with the new scale offset and then returns at 166. If, at 163, the signal on trace 1 is not that initially displayed there, it must be the signal initially displayed on trace 2 and, accordingly, the program at 165 sets the Trace1_offset2 register in accordance with the new scale offset and then returns.

If, at 161, the trace 1 scale offset switch was not activated, then it must have been the trace 2 scale offset switch and, accordingly, the program at 167 modifies the trace 2 scale offset accordingly and then checks, at 168, to see if the signal displayed on trace 2 is that which was initially displayed on trace 1. If so, the program at 169 sets the Trace2_offset1 register in accordance with the new scale offset and then returns. If, at 168, the signal on trace 2 is not that initially displayed on trace 1, the program next checks at 170 to see if it is that which was initially displayed on trace 2. If not, it returns at 166 and, if so, it first at 171 sets the Trace2_offset2 register in accordance with the new scale offset before returning.

Figure 19:
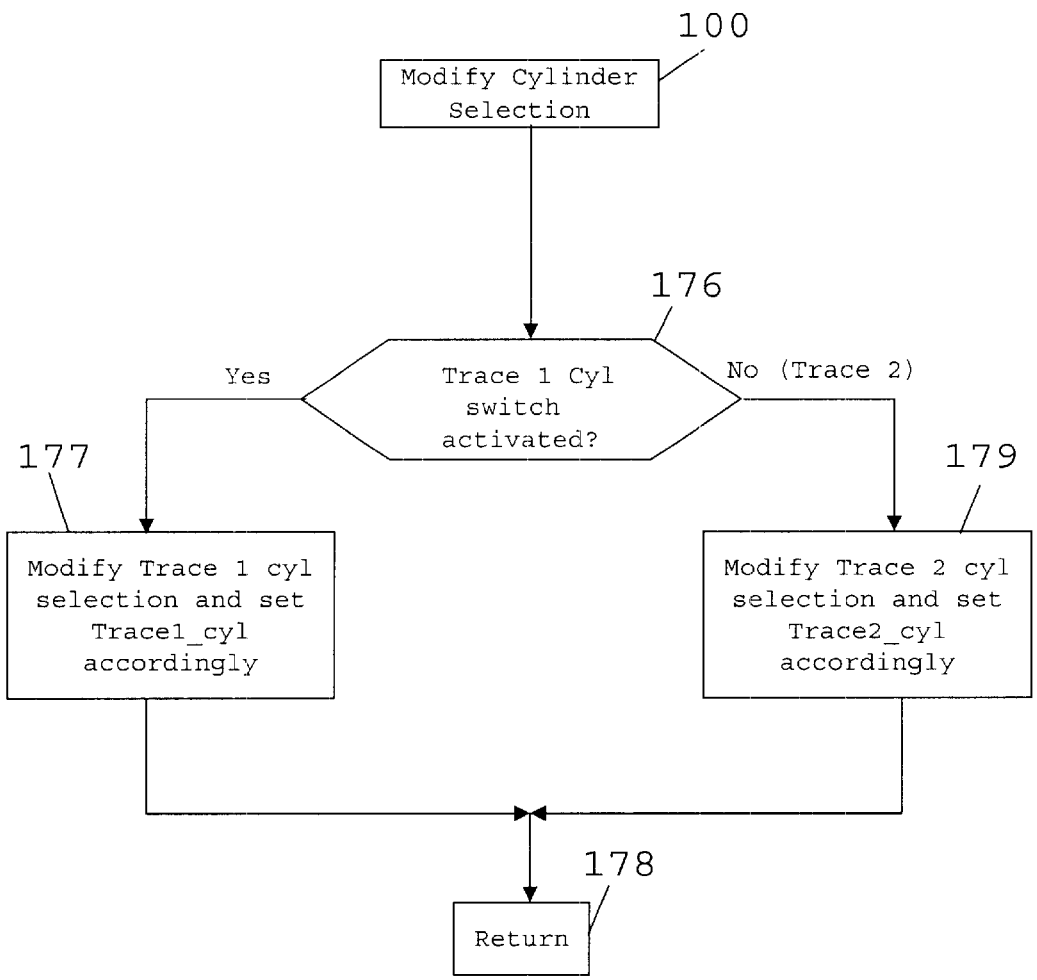

The Modify Cylinder Selection subroutine called at 100 in FIG. 14, is designated 175 in FIG. 19. The routine first, at 176, checks to see if the trace 1 Cylinder switch (icon 42) has been activated. If it has, the program at 177 modifies the trace 1 cylinder selection and sets the Trace1_cyl register accordingly and then returns at 178 to the process control panel routine of FIG. 14. If, at 176, the trace 1 Cylinder switch was not activated, then it must have been the trace 2 Cylinder switch and, accordingly, the program at 179 modifies the trace 2 cylinder selection and sets the Trace2_cyl register accordingly before returning.

Figure 20:
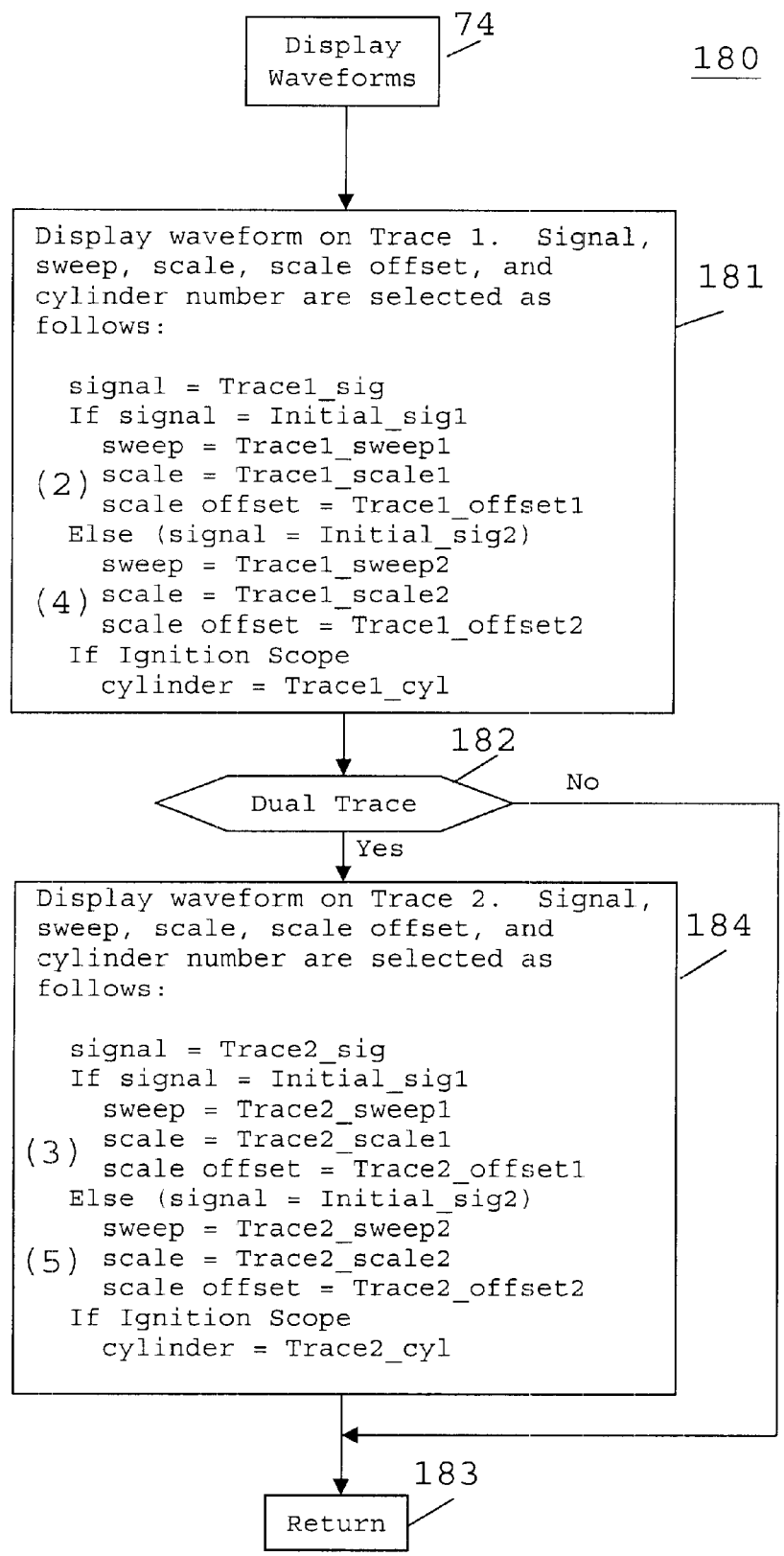

The Display Waveforms subroutine called at 74 in FIG. 12, is designated 180 in FIG. 20. The program at 181 displays the waveform on trace 1. If the signal on trace 1 is the one which was initially displayed on trace 1, the program selects the display parameter in accordance with register set (2). Otherwise, if the signal is that initially displayed on trace 2, then the display parameters are set in accordance with register set (4). In the Ignition Scope display mode, the cylinder displayed is stored in the Trace1_cyl register of set (6). Then, at 182, the program check to see if it is in dual-trace mode. If not, it returns at 183. If so, it next at 184, displays the waveform on trace 2. If the signal displayed on trace 2 is that initially displayed on trace 1, the program selects the display parameters in accordance with register set (3). Otherwise, if the signal is that initially displayed on trace 2, the display parameters are set in accordance with register set (5). In the Ignition Scope display mode, the cylinder displayed is stored in the Trace2_cyl register of set (6) and then the program returns at 183.

From the foregoing, it can be seen that there has been provided an improved digital engine analyzer with an oscilloscope display, operable in single-trace and dual-trace modes and in live and freeze modes and operable so that the user can selectively reconfigure a frozen display screen format by varying certain display parameters, including the number of traces, the signal displayed on a trace, the engine sweep, the scale and the scale offset and, in the case of a cylinder sweep, the cylinder displayed.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

We claim:

1. Apparatus for monitoring analog input waveforms comprising:

waveform acquisition circuitry including signal pickup leads adapted to be coupled to an associated source for respectively receiving different analog input signals and generating digitized waveform data representative of such analog signals, a memory for storing digitized waveform data, a display device having a display screen for displaying stored waveform data from one or more input signals in a screen display format which includes one or more waveform representations on one or more traces, and a processor coupled to said waveform acquisition circuitry and to said memory and to said display device and operable under stored program control for controlling storage and display of waveform data, said processor executing a program which includes:
- (a) a mode control routine for selectively operating said display device in either a live mode in which acquired waveform data is displayed in a predetermined format substantially currently as acquired or a freeze mode in which a previously acquired waveform screen display is frozen on the screen in the predetermined format, said mode control routine including a portion cooperating with said memory to store for at least one trace selected display format parameters corresponding to waveform signals, if any, initially displayed on the at least one trace and another trace when the freeze mode is entered, and
- (b) a freeze control routine selectively operable in the freeze mode for reconfiguring a frozen screen display format by altering the number of traces and/or the assignment of plural signals to plural traces.

2. The apparatus of claim 1, and further comprising a user interface coupled to said processor for effecting selective operation of said freeze control routine.

3. The apparatus of claim 1, wherein said mode control routine includes a portion responsive to selection of the freeze mode for establishing initial conditions for the frozen screen display format corresponding to the conditions of the last-displayed screen display format in live mode.

4. The apparatus of claim 1, wherein said memory includes a portion for storing a library of predetermined waveform patterns, said program including a portion cooperating with said display device for displaying a waveform pattern from the library.

5. The apparatus of claim 1, wherein the screen display format of the display device includes an amplitude scale for each trace, said freeze control routine including a portion for altering the scale on a trace of a frozen screen display format.

6. The apparatus of claim 5, wherein said scale includes a scale offset which defines the zero amplitude location along the vertical axis of the trace, said freeze control routine including a portion for altering the scale offset location on a trace of a frozen screen display format.

7. The apparatus of claim 1, wherein the maximum number of available traces is N, said program including a portion cooperating with said memory for establishing for each of the N traces N sets of registers respectively corresponding to the waveform signals, if any, initially displayed in the frozen screen format when the freeze mode is entered, and with the registers of each set storing selected display parameters of the associated waveform signal.

8. Engine analyzer apparatus for monitoring waveforms from an associated multi-cylinder internal combustion engine in which the cylinders are fired in a predetermined firing order, said apparatus comprising:

waveform acquisition circuitry including signal pickup leads adapted to be coupled to an associated engine for respectively receiving different analog input signals including primary and secondary ignition signals therefrom and generating digitized waveform data representative of such analog signals, a memory for storing digitized waveform data together with information correlating stored waveform data with engine cylinders, a display device having a display screen for displaying stored waveform data from one or more input signals in a screen display format which includes one or more waveform representations on one or more traces with each trace having a selected engine sweep in the case of ignition waveforms, and a processor coupled to said waveform acquisition circuitry and to said memory and to said display device and operable under stored program control for controlling storage and display of waveform data, said processor executing a program which includes:
- (a) a mode control routine for selectively operating said display device in either a live mode in which acquired waveform data is displayed in a predetermined format substantially currently as acquired or a freeze mode in which a previously acquired waveform screen display is frozen on the screen in the predetermined format, said mode control routine including a portion cooperating with said memory to store for at least one trace selected display format parameters corresponding to waveform signals, if any, initially displayed on the at least one trace and another trace when the freeze mode is entered, and
- (b) a freeze control routine selectively operable in the freeze mode for reconfiguring a frozen screen display format by
  - (1) altering the number of traces and/or the signal displayed on a trace, and/or
  - (2) altering the engine sweep in the case of ignition signals.

9. The apparatus of claim 8, and further comprising a user interface coupled to said processor for effecting selective operation of said freeze control routine.

10. The apparatus of claim 8, wherein said freeze control routine includes a portion responsive to selection of the freeze mode for establishing initial conditions for the frozen screen display format corresponding to the conditions of the last-displayed screen display format in live mode.

11. The apparatus of claim 8, wherein said memory includes a portion means for storing a library of predetermined waveform patterns, said program including a portion cooperating with said display device for displaying a waveform pattern from the library.

12. The apparatus of claim 8, wherein the screen display format of the display device includes an amplitude scale for each trace, said freeze control routine including a portion for altering the scale on a trace of a frozen screen display format.

13. The apparatus of claim 12, wherein said scale includes a scale offset which defines the zero amplitude location along the vertical axis of the trace, said freeze control routine including a portion for altering the scale offset location on a trace of a frozen screen display format.

14. The apparatus of claim 8, wherein said freeze control routine includes a portion for altering the cylinder displayed on a trace of a frozen screen display format with cylinder sweep.

15. The apparatus of claim 8, wherein the maximum number of available traces is N, said program including a portion cooperating with said memory for establishing for each of the N traces N sets of registers respectively corresponding to the waveform signals, if any, initially displayed in the frozen screen format when the freeze mode is entered, and with the registers of each set storing selected display parameters of the associated waveform signal.

16. The apparatus of claim 8, wherein said program includes a portion for controlling display of ignition waveform representations with an engine sweep selected from among a plurality of available engine sweeps including:

(a) a cylinder sweep which displays a single cylinder cycle of the waveform across the width of the display screen, wherein a cylinder cycle is the time from the firing of one cylinder to the firing of the next cylinder in the firing order;

(b) a parade sweep which displays a complete engine cycle of the waveform with the cylinders spaced horizontally across the width of the screen, wherein an engine cycle is the time between consecutive firings of the same cylinder; and (c) a raster sweep which displays the waveform over a complete engine cycle with the cylinders stacked vertically one on top of the other on the same time base.

17. Engine analyzer apparatus for monitoring waveforms from an associated multi-cylinder internal combustion engine in which the cylinders are fired in a predetermined firing order, said apparatus comprising:

waveform acquisition circuitry including signal pickup leads adapted to be coupled to an associated engine for respectively receiving different analog input signals including primary and secondary ignition signals therefrom and generating digitized waveform data representative of such analog signals, a memory for storing digitized waveform data together with information correlating stored waveform data with engine cylinders, a display device having a display screen for displaying stored waveform data from one or more input signals in a screen display format having a selected engine sweep in the case of ignition waveforms, and a processor coupled to said waveform acquisition circuitry and to said memory and to said display device and operable under stored program control for controlling storage and display of waveform data, said processor executing a program which includes:

(a) a mode control routine for selectively operating said display device in either a live mode in which acquired waveform data is displayed in a predetermined format substantially currently as acquired or a freeze mode in which a previously acquired waveform screen display is frozen on the screen in the predetermined format, and (b) a freeze control routine selectively operable in the freeze mode for reconfiguring a frozen screen display format by altering the engine sweep in the case of ignition signals.

18. The apparatus of claim 17, wherein said program includes a portion for controlling display of ignition waveform representations with an engine sweep selected from among a plurality of available engine sweeps including:

(a) a cylinder sweep which displays a single cylinder cycle of the waveform across the width of the display screen, wherein a cylinder cycle is the time from the firing of one cylinder to the firing of the next cylinder in the firing order;

(b) a parade sweep which displays a complete engine cycle of the waveform with the cylinders spaced horizontally across the width of the screen, wherein an engine cycle is the time between consecutive firings of the same cylinder; and (c) a raster sweep which displays the waveform over a complete engine cycle with the cylinders stacked vertically one on top of the other on the same time base.

19. The apparatus of claim 18, wherein said freeze control routine includes a portion for altering the cylinder displayed on a frozen screen display format with cylinder sweep.

20. The apparatus of claim 17, wherein the program includes a portion for controlling the display device to display waveform data in a screen display format which includes one or more waveform representations on one or more of N available traces, and cooperating with said memory for establishing for each of the N traces a set of registers respectively corresponding to the waveform signals, if any, initially displayed in the frozen screen format when the freeze mode is entered, and with the registers of each set storing selected display parameters of the associated waveform signal.

* * * * *